(12) United States Patent
Yamamoto et al.

(10) Patent No.: US 9,340,863 B2
(45) Date of Patent: May 17, 2016

(54) MULTILAYER HARD FILM AND METHOD FOR PRODUCING SAME

(71) Applicants: KOBE STEEL, LTD., Kobe-shi (JP); ISCAR LTD., Tefen (IL)

(72) Inventors: Kenji Yamamoto, Hyogo (JP); Albir A. Layyous, Me'ilya (IL)

(73) Assignees: Kobe Steel, Ltd., Kobe-shi (JP); ISCAR LTD., Tefen (IL)

( * ) Notice: Subject to any disclaimer, the term of this patent is extended or adjusted under 35 U.S.C. 154(b) by 4 days.

(21) Appl. No.: 14/365,436

(22) PCT Filed: Dec. 14, 2012

(86) PCT No.: PCT/JP2012/082575
§ 371 (c)(1),
(2) Date: Jun. 13, 2014

(87) PCT Pub. No.: WO2013/089254
PCT Pub. Date: Jun. 20, 2013

(65) Prior Publication Data
US 2014/0363648 A1  Dec. 11, 2014

(30) Foreign Application Priority Data

Dec. 15, 2011  (JP) .................. 2011-274956
Dec. 15, 2011  (JP) .................. 2011-274960

(51) Int. Cl.
*C23C 14/06* (2006.01)
*C23C 28/04* (2006.01)
(Continued)

(52) U.S. Cl.
CPC ............. *C23C 14/0664* (2013.01); *C23C 14/06* (2013.01); *C23C 14/325* (2013.01);
(Continued)

(58) Field of Classification Search
USPC ............ 51/307, 309; 428/697, 698, 699, 701, 428/702, 704; 427/255, 419.1, 419.7; 204/192, 192.15, 192.16
See application file for complete search history.

(56) References Cited

U.S. PATENT DOCUMENTS 7,258,912 B2 * 8/2007 Yamamoto .......... C23C 14/0036
428/212
7,758,950 B2 * 7/2010 Moriguchi .......... C23C 14/0015
428/698

(Continued)

FOREIGN PATENT DOCUMENTS

CN   101121309 A   2/2008
JP   2007-90483    4/2007
(Continued)

OTHER PUBLICATIONS

International Search Report issued Jan. 22, 2013, in PCT/JP2012/082575, filed Dec. 14, 2012.
(Continued)

*Primary Examiner* — Archene Turner
(74) *Attorney, Agent, or Firm* — Oblon, McClelland, Maier & Neustadt, L.L.P

(57) ABSTRACT

Provided is a multilayer hard film capable of elongating a lifetime of a member. A multilayer hard film (1) is formed by alternately stacking a layer A (11) made of $Ti_{1-x}Si_x(B_pC_qN_r)$ [where $0.05 \le x \le 0.4$, $p \ge 0$, $q \ge 0$, $r > 0$, $p+q+r=1$], and a layer B (12) made of at least one selected from the group of $Ti_{1-a-g-b}B_aC_gN_b$ [where $0.05 \le a \le 0.5$, $0.25 \le b \le 0.6$, $0 \le g \le 0.5$], $Si_{1-c-d}C_cN_d$ [where $0.2 \le c \le 0.5$, $0.25 \le d \le 0.5$], $B_{1-e-f}C_eN_f$ [where $0.03 \le e \le 0.25$, $0.3 \le f \le 0.55$], $TiB_2$, SiC and $B_4C$, one another over the surface of the substrate (2).

17 Claims, 3 Drawing Sheets

(51) Int. Cl.
*C23C 28/00* (2006.01)
*C23C 14/32* (2006.01)
*C23C 14/34* (2006.01)

(52) U.S. Cl.
CPC .............. *C23C 14/34* (2013.01); *C23C 28/042* (2013.01); *C23C 28/044* (2013.01); *C23C 28/42* (2013.01); *C23C 28/44* (2013.01); *Y10T 428/24975* (2015.01)

(56) References Cited

U.S. PATENT DOCUMENTS

| | | | | |
|---|---|---|---|---|
| 7,935,426 | B2 * | 5/2011 | Vetter | C23C 14/027 428/698 |
| 7,967,275 | B2 * | 6/2011 | Yamamoto | C23C 14/0641 428/697 |
| 8,309,234 | B2 * | 11/2012 | Vetter | C23C 14/022 204/192.15 |
| 8,309,235 | B2 * | 11/2012 | Vetter | C23C 14/024 428/699 |
| 8,389,108 | B2 * | 3/2013 | Moriguchi | C23C 14/0036 428/216 |
| 8,784,986 | B2 * | 7/2014 | Chang | C23C 14/35 428/336 |
| 8,911,867 | B2 * | 12/2014 | Vetter | C23C 14/0605 204/192.1 |
| 2005/0170162 | A1 | 8/2005 | Yamamoto et al. | |
| 2006/0222893 | A1 | 10/2006 | Derflinger et al. | |
| 2007/0275179 | A1 | 11/2007 | Astrand et al. | |

FOREIGN PATENT DOCUMENTS

| | | | |
|---|---|---|---|
| JP | 2007-126714 | * | 5/2007 |
| JP | 3914687 | | 5/2007 |
| JP | 2007-152544 | | 6/2007 |
| JP | 4184691 | | 11/2008 |
| JP | 2010-031340 | * | 2/2010 |
| JP | 2010-207922 | | 9/2010 |
| JP | 2010-228032 | | 10/2010 |
| KR | 2007-0050862 | | 5/2007 |

OTHER PUBLICATIONS

Combined Office Action and Search Report issued Jun. 1, 2015 in Chinese Patent Application No. 201280061985.8 (with English language translation and English Translation of Category of Cited Documents).

Office Action in corresponding Korean Application No. 10-2014-7015483, dated Sep. 24, 2015.

Extended Search Report issued Oct. 12, 2015 in European Patent Application No. 12857851.5.

* cited by examiner

MULTILAYER HARD FILM AND METHOD FOR PRODUCING SAME

TECHNICAL FIELD

The present invention relates to a multilayer hard film including at least one layer of $Ti_{1-x}Si_x(B_pC_qN_r)$ formed on a surface of a substrate of a slide member over which other member slides or a cutting tool for use in metal cutting processes. Herein, the slide member includes, for example, a jig, and a mechanical component such as a die for molding and a punch each requiring wear resistance. Further, the present invention relates to a method for producing the multilayer hard film.

BACKGROUND ART

In order to improve the wear resistance and elongate tool lifetimes, layers (or films) stacked of, for example, $TiB_2$, $B_4C$, SiC and the like are commonly formed on a surface of a substrate of a slide member or a metal cutting tool. Since a film made of a material such as $TiB_2$, $B_4C$ and SiC has extremely high hardness (approximately 40 GPa), such a film formed on the surface of the slide member or of the metal cutting tool is called, for example, a hard film. Herein, a film formed by stacking a plurality of layers made of the above materials is particularly called a multilayer hard film. Here, various techniques of forming a hard film or a multilayer hard film using at least one layer made of $TiB_2$, $B_4C$, SiC, and the like are disclosed in Patent Literatures 1-5.

Patent Literature 1 discloses formation of a multilayer hard film made by stacking a $TiB_2$ layer, a two-phase mixed layer of $TiB_2$ and TiN phases, and a TiAlN layer in this order on a surface of a tool base formed of a cubic boron nitride-based material sintered under an ultrahigh pressure.

Patent Literature 2 discloses formation of a hard film on a surface of a base, where the hard film contains at least one $TiB_2$ sublayer having a fibrous microstructure in which fibrous particles having a predetermined diameter and a predetermined length are oriented in the direction perpendicular to the surface of the base.

Patent Literature 3 discloses formation of a multilayer hard film made by stacking a BCN layer, a $B_4C$ layer, and a TiAlN layer in this order on a surface of a tool base formed of a cubic boron nitride-based material sintered under an ultrahigh pressure.

Patent Literature 4 discloses formation of a hard film made of SiC on a surface of a base.

Patent Literature 5 discloses a procedure for including at least one kind of ultramicroparticle made of a material selected from $B_4C$, BN, $TiB_2$, TiB, TiC, WC, SiC, $SiN_x$ (x=0.5 to 1.33), and $Al_2O_3Al$, into a hard film. The main component of the hard film is a nitride or a carbonitride of at least one kind of element selected from the Group 4A, Group 5A and Group 6A elements and Al.

The films disclosed in Patent Literatures 1-5 have high hardness and the wear resistance as well as other preferable properties via improvement of a stacked film. However, the difference in hardness between the substrate and the hard film leads to poor adhesion of the hard film to the substrate, which frequently terminates in the hard film peeling off the surface of the substrate. This results in a major drawback of a shortened lifetime of the cutting tool.

In order to overcome the above drawbacks, in Patent Literature 1, an attempt is made to improve the adhesion of hard films to substrates and to elongate the lifetime of the slide member by using the cubic boron nitride-based ultra high pressure-sintered material. Additionally, in Patent Literature 3, an additional attempt is made to further improve the adhesion of the film to the surface of the base which constitutes the tool and is formed of the cubic boron nitride-based ultra high pressure-sintered material, and elongate the lifetime of the base constituting the tool by forming the BCN layer between the $B_4C$ layer and the surface of the base (as a slide member) constituting the tool. Further, in Patent Literature 5, an attempt is made to improve the adhesion of the hard film and to elongate the lifetime of the slide member by including $TiB_2$, $B_4C$, SiC, and the like in the hard film.

CITATION LIST

Patent Literatures

[Patent Literature 1] Japanese Unexamined Patent Publication No. 2010-228032

[Patent Literature 2] Japanese Patent Publication No. 4184691

[Patent Literature 3] Japanese Unexamined Patent Publication No. 2010-207922

[Patent Literature 4] Japanese Unexamined Patent Publication No. 2007-090483

[Patent Literature 5] Japanese Patent Publication No. 3914687

SUMMARY OF INVENTION

Technical Problems to be Solved by the Invention

Although the $TiB_2$ layer and the $B_4C$ layer, in the multilayer films disclosed in Patent Literatures 1-5, are superior in hardness, they are insufficient in the oxidation resistance. Thus, sliding members or metal cutting tools coated with a $TiB_2$ or a $B_4C$ layer of those patent literatures have a reduced lifetimes caused by oxidation of these films at elevated working temperature, The SiC layer disclosed in Patent Literatures 4 and 5, is superior in hardness and oxidation resistance. However, the adhesion of the SiC layer to the base is insufficient, leading to the above mentioned drawback that the SiC layer of those patent literatures fails to elongate the lifetime of sliding members or of metal cutting tools The present invention has been developed in view of the above drawbacks. Hence, an object of the present invention is to provide a multilayer hard film which sufficiently elongates a lifetime of a substrate included in a slide member or a metal working cutting tool.

Means for Solving the Problems (i) In order to accomplish the above object, the present invention provides a multilayer hard film formed on a surface of a substrate. The multilayer hard film includes: one or more layers A each being formed of $Ti_{1-x}Si_x(B_pC_qN_r)$, where $0.05 \leq x \leq 0.4$, $p \geq 0$, $q \geq 0$, $r > 0$, and $p+q+r=1$; and one or more layers B each consisting of at least one selected from the group consisting of $Ti_{1-a-b-g}B_aC_gN_b$, $Si_{1-c-d}C_cN_d$, $B_{1-e-f}C_eN_f$, $TiB_2$, SiC, and $B_4C$, where $0.05 \leq a \leq 0.5$, $0.25 \leq b \leq 0.6$, $0.2 \leq c \leq 0.5$, $0.25 \leq d \leq 0.5$, $0.03 \leq e \leq 0.25$, $0.3 \leq f \leq 0.55$, and $0 \leq g \leq 0.5$. The layer A and the layer B are alternately stacked one or more times over the surface to form a stack. A single layer B formed on a single layer A is a pair. The multilayer hard film includes one or more pairs.

The term "substrate" is defined as being the substrate of either a cutting tool for use in metal cutting processes or of a slide member. The term "slide member" is hereinafter defined as parts of jigs, mechanical components such as molds, dies, and punches. The term "member" is defined as a substrate coated with a multilayer hard film of any of the embodiments of the invention.

As described above, according to the present invention, a hard film (that is, multilayer hard film) is realized by stacking the layer A and the layer B one or more times, where each layer A has high hardness and excellent oxidation resistance, and each layer B has low crystallinity close to an amorphous structure after the film formation. This construction makes the crystal growth in each layer A terminate at an interface between the layer A and the layer B, wherein the layer B has a near amorphous structure. Consequently, the grain size of the crystals in the layer A is not likely to become large, allowing for increased micronization of the crystal grains in the layer A. The increased micronization of crystal grains in the layer A increases the hardness of the layer A, which, in turn, increases the hardness of the multilayer hard film. Therefore, a stack formed by stacking the layer A and the layer B multiple times enables the multilayer hard film to definitely improve the wear resistance and oxidation resistance, thereby to elongate the lifetime of the member.

(ii) In the multilayer hard film described in the above section (i), each layer B is formed of at least one selected from $Ti_{1-a-g-b}B_aC_gN_b$, $Si_{1-c-d}C_cN_d$, and $B_{1-e-f}C_eN_f$ and has a thickness of 2 nm to 50 nm, preferably 2 nm to 20 nm, and preferably thickness of each the layers A is 100 nm or less.

Since each layer B of section (ii) contains a predetermined amount of nitrogen (N), each layer B has the excellent lubricity and adhesion to the layer A, and in addition to the high hardness. Moreover, since the layer A has a predetermined thickness, crystal grains in each layer B are micronized, which results in increasing the hardness of the layer. This allows for the improvement of the wear resistance and of the oxidation resistance of the multilayer hard film with high reliability. Consequently, the lifetime of the member can be elongated.

(iii) According to the multilayer hard film described in the above section (i), wherein each layer B is formed of at least one selected from $TiB_2$, $SiC$, and $B_4C$, a thickness of each layer B is at least 50 nm, and a thickness of each layer A is at least 100 nm. In addition, it is preferable that the multilayer hard film has a stack on the surface of the substrate. Preferably that stack is formed on the surface of the substrate by alternately stacking the layer A and the layer B in one or more pairs.

The above mentioned construction enables the layer A to have superior oxidation resistance, and sufficiently high hardness, while the hardness is not so high as that of the layer B. In addition, the layer A exhibits satisfactory adhesion to the layer B or the substrate. Those features as mentioned hereinbefore make it possible to improve the adhesion of the layers B to the substrate via forming the layer A having at least a predetermined thickness between adjacent B layers or between the undermost B layer and the substrate. Here, note each layer B is extremely hard and superior in wear resistance.

(iv) In the multilayer hard coating layer described in the above section (ii), the total thickness of the stack formed of the layers A and B is at least 500 nm.

(v) In the multilayer hard coating layer described in the above section (iii), the total thickness of the stack formed of the layers A and B is at least 500 nm.

The above described stack, in which the layers A and B are alternately stacked to have a total thickness of the predetermined length like at least 500 nm, certainly increases the wear resistance and the oxidation resistance of a multilayer hard film. Accordingly, the lifetime of the member is elongated.

(vi) Optionally, in the multilayer hard film as described in section (iii), at least one of the layers B further includes nitrogen.

The at least one layer B including nitrogen has improved lubricity which allows the lifetime of the member to be further elongated.

(vii) In another embodiment of the invention, the multilayer hard film described in section (iii) is formed by arranging a single pair of the layer A on the surface of the substrate, and then the layer B on that layer A.

In this case, the number of the interfaces between the stacked layers in the multilayer hard film is minimal. Therefore, the adhesion is not likely to be lowered, so that the lifetime of the member can be further elongated.

(viii) The multilayer hard film described in section (i) further includes an underlying layer which is formed between the substrate and the undermost layer A of the stack in which the layers A and B are alternately stacked. Herein, the underlying layer contains $M_{1-y}Al_y(B_aC_bN_cO_d)$, where $0.05 \leq y \leq 0.8$, $0 \leq a \leq 0.2$, $0 \leq b \leq 0.4$, $0.5 \leq c \leq 1$, $0 \leq d \leq 0.2$, and M is one or more kinds of elements selected from Si, Y, Group 4A elements, Group 5A elements, and Group 6A elements of the Periodic Table.

(xi) The multilayer hard film described in section (viii) preferably has the underlying layer formed of one or a combination of AlCr(CN), TiAl(CN), TiCrAl(CN), AlCrSi(CN), TiAlSi(CN), and TiCrAlSi(CN).

In the multilayer hard film described in sections (viii) and (xi), the arrangement of the underlying layer between the substrate of the member and the undermost layer A of the stack in which the layers A and B layers are alternately stacked can improve the adhesion of the multilayer hard film to the substrate. Thus, the lifetime of the member is further elongated.

(x) According to the multilayer hard film described in any one of section (i) to section (xi), the substrate is a metal cutting tool.

(xi) According to the multilayer hard film described in any one of section (i) to section (xi), the substrate is a slide member.

(xii) The multilayer hard film described in any one of section (i) to section (xi) is formed by alternately stacking the layer A and the layer B one another resulting in a stack consisting of pairs of alternating A layers and B layers.

The multilayer hard coating layer having the above mentioned structure improves and increases the wear resistance and the oxidation resistance thereof. In addition, the structure enables the adhesion of the layers B to the substrate to be improved. Thus, both effects contribute to the elongation of the lifetime of the member.

(xiii) In another embodiment of the invention, the multilayer hard film described in section (viii) or section (xi) preferably consists of the underlying layer, and the layers A and B.

In that structure, the underlying layer can further improve the adhesion between the substrate and the layer A that is closest to the substrate. Consequently, the lifetime of the member can be improved.

(xiv) In the multilayer hard film described in section (vi), it is preferable that at least one of the layers B is formed of at least one selected from the group consisting of TiBN, SiCN and BCN.

In the multilayer hard film having the above mentioned structure, one or more layers B are formed of one or more components selected from the group consisting of TiBN, SiCN and BCN, and/or one or more layers B are formed of one or more components selected from the group consisting of $TiB_2$, SiC and $B_4C$. In the above mentioned structure, the layers B are extremely hard and excellent in their wear resistance. Furthermore, the layers B containing N are excellent in lubricity. Therefore, the lifetime of the member can be elongated by incorporation of the B layers containing N in the stack.

(xv) In the multilayer hard film described in any one of section (i) to section (iii), it is preferable that the stack is formed on the surface of the substrate via alternately stacking the A layer and the B layer one another by using a film-formation system. The film-formation system includes a vacuum arc vaporization source and a sputtering evaporation source both of which are arranged in a chamber. The vacuum arc vaporization source is equipped with a target material for forming the layer A, and the sputtering evaporation source is equipped with a target material for forming the layer B.

The multilayer hard film is preferably formed in the steps of: rotating the substrate in the chamber such that the substrate passes multi times in front of the vacuum arc vaporization source and the sputtering evaporation source; and making the vacuum arc vaporization source and the sputtering evaporation source concurrently discharge so as to form a stack by alternately stacking the layer A and the layer B in pairs multiple times.

The above method using the film-formation system facilitates not only a rapid formation of a multilayer hard film via quickly stacking a layer A and a layer B alternately, but also improvement of the adhesion at the interface between each layer A and layer B.

(xvi) The present invention provides a method for producing a multilayer hard film formed on a surface of a substrate. The method includes the steps of: forming an A layer of $Ti_{1-x}Si_x(B_pC_qN_r)$, where $0.05 \leq x \leq 0.4$, $p \geq 0$, $q \geq 0$, $r > 0$, and $p+q+r=1$; forming a layer B consisting of at least one of $Ti_{1-a-b-g}B_aC_gN_b$, $Si_{1-c-d}C_cN_d$, $B_{1-e-f}C_eN_f$, $TiB_2$, SiC, and $B_4C$, where $0.05 \leq a \leq 0.5$, $0.25 \leq b \leq 0.6$, $0.2 \leq c \leq 0.5$, $0.25 \leq d \leq 0.5$, $0.03 \leq e \leq 0.25$, $0.3 \leq f \leq 0.55$, and $0 \leq g \leq 0.5$; and alternately stacking the layer A and the layer B one over the other over the surface of the substrate.

The above mentioned method allows the multilayer hard coating layer described in section (i) to be formed on the surface of the substrate.

Effect of the Invention

In accordance with the present invention, it is possible to provide the multilayer hard film capable of elongating the lifetime of the member.

EMBODIMENTS FOR CARRYING OUT THE INVENTION

Hereinafter, embodiments for carrying out the present invention will be explained in detail with reference to FIGS. 1 to 5.

Figure 1:
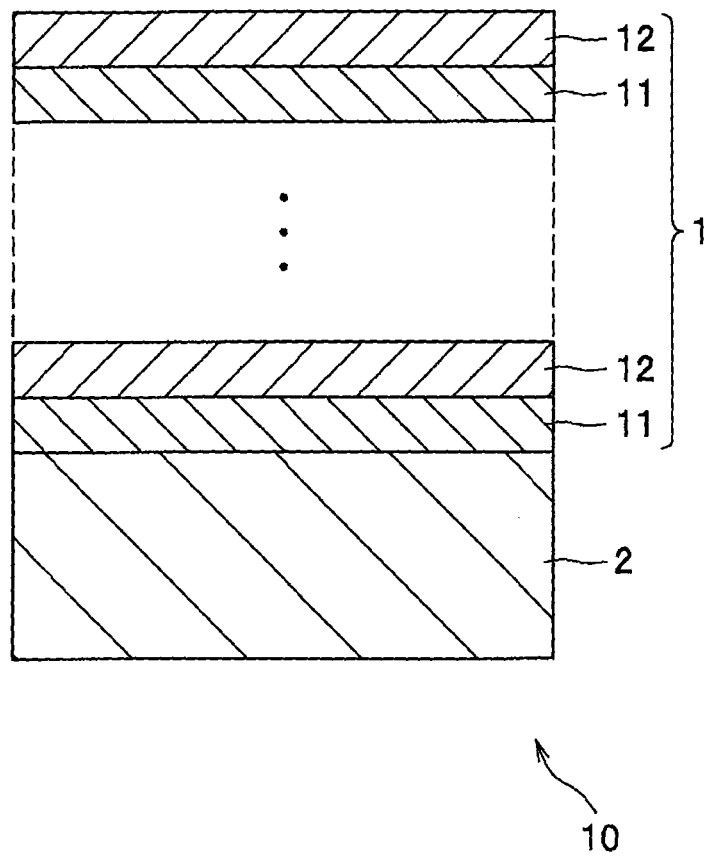
FIG. 1 is a schematic cross-sectional view of a multilayer hard film according to a first embodiment and/or second embodiment of the present invention.

A multilayer hard film is provided by the present invention, and first and second embodiments will be shown in FIG. 1.

FIG. 1 schematically shows a cross-section of a member 10 such as a metal cutting tool or a slide member. Here, a multilayer hard film 1 of the first and second embodiments is formed on a surface of a substrate 2 included in the member 10.

In the multilayer hard film in FIG. 1, a layer 11 (layer A) and a layer 12 (layer B) are alternately stacked one over the other to form a stack including the plurality of layers 11 and 12 over the surface of the substrate 2. Layer 11 will be referred to as layer A 11 and layer 12 will be referred to as layer B12.

The respective layers A 11 are formed of $Ti_{1-x}Si_x(B_pC_qN_r)$, where $0.05 \leq x \leq 0.4$, $p \geq 0$, $q \geq 0$, $r > 0$, and $p+q+r=1$.

Note each layer A 11 is needed to have high hardness and high oxidation resistance. Thus, the atomic ratio "x" of Si (silicon) in $Ti_{1-x}Si_x(B_pC_qN_r)$ should be set in 0.05 to 0.4. If the atomic ratio "x" of Si in $Ti_{1-x}Si_x(B_pC_qN_r)$ is less than 0.05, the oxidation resistance is too low to elongate the lifetime of the member 10. Further, if the atomic ratio "x" of Si in $Ti_{1-x}Si_x(B_pC_qN_r)$ exceeds 0.4, the layer A 11 becomes amorphous and thereby decreasing the hardness of the layer A 11. This decrease in the hardness results in failure for elongating the lifetime of the member. Accordingly, it is preferable that the atomic ratio "x" of Si in $Ti_{1-x}Si_x(B_pC_qN_r)$ is set in 0.1 to 0.3.

Further, the layer A 11 must contain N (nitrogen), and optionally may contain B (boron) and/or C (carbon). Note preferably the atomic ratio "p" of B is 0.3 or less, and more preferably 0.2 or less. Further, preferably the atomic ratio "q" of C is 0.6 or less, and more preferably 0.4 or less. When the atomic ratio "p" of B is equal to or less than 0.2 and the atomic ratio "q" of C is equal to or less than 0.4, it is possible to maintain the sufficient hardness of the layer A 11.

It is preferable that a thickness of the layer A 11 is set as proportional to a thickness of the layer B 12. In the first embodiment of the invention, the respective layers B 12 are formed of at least one of $Ti_{1-a-g-b}B_aC_gN_b$, $Si_{1-c-d}C_cN_d$, and $B_{1-e-f}C_eN_f$ with a thickness of 2 nm to 50 nm, where $0.05 \leq a \leq 0.5$, $0.25 \leq b \leq 0.6$, $0.2 \leq c \leq 0.5$, $0.25 \leq d \leq 0.5$, $0.03 \leq e \leq 0.25$, $0.3 \leq f \leq 0.55$ and $0 \leq g \leq 0.5$, it is preferable that each thickness of the layers A is set in 100 nm or less.

According to the second embodiments shown in FIG. 1, when the respective layers B 12 are formed of at least one selected from $TiB_2$, SiC and $B_4C$, a thickness of the respective layers B 12 is set as at least 50 nm, and a thickness of the respective layers 11 A is set as at least 100 nm. Further, the layer 11 A and the layer B 12 are alternately stacked one over the other in this order one or more times to form the stack on the surface of the substrate 2.

In the first and second embodiments, layer A 11 is formed on the near amorphous layer B 12. Consequently, layer B 12 has micronization effect on the crystal grains in each layer A 11 and thus increasing the hardness of each layer A 11 (referred to as "micronization effect"). In the first embodiment of the present invention, the thickness of each layer A 11 should preferably be 100 nm or less as mentioned above in order to maintain a ratio between the total thickness of the layers A 11 and the total thickness of the layers B 12 at a predetermined value. In other words, if the thickness of the layer A 11 exceeds 100 nm, the desired effect of the layer B 12 in the stack is diluted, resulting in failure to obtain the excellent hardness, oxidation resistance and adhesion to the substrate, nonetheless all of the properties must be needed for a multilayer hard film. Note the thickness of each layer 11 A is preferably set in 10 nm to 50 nm, and more preferably 10 nm to 20 nm.

In addition, the formation of the layer A 11 can improve the adhesion of the layer B 12 to the substrate 2. Therefore, it is preferable that the undermost layer of the multilayer hard film 1 be formed of the layer A 11 between the surface of the substrate 2 and the undermost layer B 12 located closest to the substrate 2.

In the first embodiment, each layer B 12 is formed of one or more components selected from the group as described above. Therefore, each layer B 12 may be formed of one component, two components appropriately selected from the group, or all the three components therefrom.

For example, when the layer B 12 is formed of two components selected from the group as described in the first embodiment, such a combination includes: SiCN and TiBN, SiCN and TiBCN, TiBN and BCN, TiBCN and BCN, or BCN and SiCN. When the layers B 12 constructing the multilayer hard film 1 include two types of layers B 12, such layers B may be respectively formed of two components selected from the group of SiCN, TiBCN and BCN. For example, the layers B 12 constructing the multilayer hard film 1 may be formed of a layer B 12 made of SiCN and a layer 12 B made of TiBN.

Further, the stack of the multilayer hard film 1 may be constructed by a pair of layer A 11 of TiSi(BCN) and a layer B 12 of TiBN, a pair of layer A 11 of TiSi(BCN) and a layer B 12 of SiCN in this order over the surface of the substrate 2. Here, when a stack of the multilayer hard film 1 is constructed by using at least all the three types of layers B 12, the stack may be formed by a pair of layer A 11 of TiSi(BCN) and a layer B 12 of TiBN, a pair of a layer A 11 of TiSi(BCN) and a layer B 12 of SiCN, pair of a layer A 11 of TiSi(BCN) and a layer B 12 of BCN in this order over the surface of the substrate 2.

Among the nitrides of SiCN, TiBN and TiBCN constituting the layer B 12, actually TiBN and TiBCN do not have high hardness. However, boron and nitrogen elements included in such a layer B 12 improve lubricity, while such elements decrease the hardness. Nonetheless, it is possible to make a film sufficiently hard, if a multilayer structure of the film is formed via alternately stacking a layer B 12 made of TiBN or TiBCN having a thickness from 2 nm to 50 nm, preferably from 2 nm to 20 nm, and a layer 11 A made of TiSi(BCN) one another.

When the atomic ratio "a" of B in $Ti_{1-a-g-b}B_aC_gN_b$ is 0.05 to 0.5, preferably 0.2 to 0.4, it is possible to achieve excellent lubricity, which allows increase in the lifetime of the member 10. In contrast, if the atomic ratio "a" of B in 0.05, in $Ti_{1-a-g-b}B_aC_gN_b$ is less than satisfactory lubricity is not achieved and the hardness becomes lower, which results in decrease in the lifetime of the member 10. Further, if the atomic ratio "a" of B in $Ti_{1-a-g-b}B_aC_gN_b$ exceeds 0.5, the hardness becomes lower, which results in decrease in the lifetime of the member 10.

In addition, when the atomic ratio "b" of N in $Ti_{1-a-g-b}B_aC_gN_b$ is 0.25 to 0.6, preferably 0.3 to 0.6, it is possible to achieve excellent lubricity. In contrast, if the atomic ratio "b" of N in $Ti_{1-a-g-b}B_aC_gN_b$ is less than 0.25, satisfactory lubricity is not achieved and the hardness becomes lower, which results in decrease in the lifetime of the member 10. Further, if the atomic ratio "b" of N in $Ti_{1-a-g-b}B_aC_gN_b$ exceeds 0.6, the hardness becomes lower, which results in no improvement for the lifetime of the member 10.

When the atomic ratio "g" of C in $Ti_{1-a-g-b}B_aC_gN_b$ is 0.5 or less, it is possible to achieve high hardness. In contrast, if the atomic ratio "g" of C in $Ti_{1-a-g-b}B_aC_gN_b$ exceeds 0.5, an unreacted C element, which is not bonded to a metal element and a B element, separates out in the layer B 12. This results in decrease in the hardness of the layer B 12, whereby the lifetime of the member 10 is not elongated.

Among the components constructing the layer B 12 as described above, SiCN contains Si and N. Therefore, SiCN has high affinity for TiSi(BCN) constructing the layer A 11 and excellent adhesion to the layer A 11.

In the case where the atomic ratio "c" of C in $Si_{1-c-d}C_cN_d$ is 0.2 to 0.5, it is possible to achieve high hardness. In contrast, if the atomic ratio "c" of C in $Si_{1-c-d}C_cN_d$ is out of the range from 0.2 to 0.5, the hardness becomes lower, which results in no elongation in the lifetime of the member 10.

In addition, in the case where the atomic ratio "d" of N in $Si_{1-c-d}C_cN_d$ is 0.25 to 0.5, preferably 0.3 to 0.5, it is possible to achieve satisfactory lubricity and high hardness. In contrast, if the atomic ratio "d" of N in $Si_{1-c-d}C_cN_d$ is out of the range from 0.25 to 0.5, the hardness becomes lower, whereby the lifetime of the member 10 is not to be elongated.

Among the nitrides selected from SiCN, TiBN, TiBCN, and BCN, which constitute the layer B 12, BCN does not have high hardness, while a B element and an N element in the BCN layer improve lubricity. Nevertheless, it is possible to achieve sufficiently high hardness by alternately stacking the layer B 12 made of BCN having a thickness of 2 nm to 50 nm, preferably 2 nm to 20 nm, and the layer A 11 including TiSi(BCN) one another.

When the atomic ratio "e" of C in $B_{1-e-f}C_eN_f$ is 0.03 to 0.25, preferably 0.1 to 0.25, it is possible to achieve high hardness. In contrast, if the atomic ratio "e" of C in $B_{1-e-f}C_eN_f$ is out of the range from 0.03 to 0.25, the hardness becomes lower.

In addition, when the atomic ratio "f" of N in $B_{1-e-f}C_eN_f$ is 0.3 to 0.55, preferably 0.4 to 0.5, it is possible to achieve satisfactory lubricity. In contrast, if the atomic ratio "f" of N in $B_{1-e-f}C_eN_f$ is out of the range from 0.3 to 0.55, the hardness becomes lower, and the lubricity can become insufficient. This results in no elongation in the lifetime of the member 10. Here, it is preferable that the atomic ratio "f" of N in $B_{1-e-f}C_eN_f$ be 0.05 to 0.2.

The thickness of each layer B 12 in the first embodiment is 2 nm to 50 nm, preferably 2 nm to 20 nm, as mentioned hereinbefore. Formation of each layer B 12 with the thickness in the above range allows the hardness of the layer A to be high as a result of the micronization effect of the crystal grains in the layer A 11. If the thickness of each layer B 12 falls below 2 nm, the crystal growth in the layer A 11 adjacent to the layer B is not sufficiently controlled, whereby the crystal grains in the layer A 11 is not sufficiently micronized. Therefore, the hardness of the layer A 11 becomes lower, and accordingly the hardness of the multilayer hard film 1 also becomes lower. Consequently, the lifetime of the member 10 is not elongated. In contrast, if the thickness of each layer B 12 exceeds 50 nm, the total ratio of the layers B thickness to the layers A thickness in the stack becomes larger, leading to decrease in the adhesion and oxidation resistance of the multilayer hard film 1. This is likely to result in no elongation of the lifetime of the member 10. It is preferable that the thickness of each layer B 12 be 2 nm to 20 nm, more preferably 5 nm to 10 nm.

Further, preferably the plurality of layers A 11 and layers B 12 in the first embodiment respectively having the thicknesses explained above form a stack by alternately stacking the layers A 11 and the layers B 12 one over the other.

The number of repetitions of forming a pair of a layer A 11 and a layer B 12 (i.e., the number of pairs of a layer A 11 and a layer B 12) in the multilayer hard film 1 may be, for example, five or more. That is, the number of pairs may be 15 or more, or 263 or more.

In the first and/or second embodiment, the composition of the respective layers A 11 constructing the stack of the multilayer hard film 1 may be the same or different each other in the stack. Further, the composition of the respective layers B 12 constructing the stack of the multilayer hard film 1 according to the first and/or second embodiment may be the same or different each other in the stack. For example, the multilayer hard film 1 according to the first and/or second embodiments may have the structure of A/B/A/B, or A/B1/A/B2/A/B3, where A denotes a layer A, B denotes a layer B, and B1, B2 and B3 denote layers B respectively having different compositions. Moreover, the composition of B1, B2 and B3 is different from the composition of each layer B 12. For example, each multilayer hard film 1 according to the present embodiment may include the structure of A/B1'/B2'/B3'/A, where B1', B2' and B3' denote layers respectively having a different range of composition from the range of composition of the layer B 12 defined above. Furthermore, the total thickness of the layers B1', B2' and B3' is within the aforementioned range of the thickness of the B layers 12.

In the second embodiment, the layers A 11 improve the adhesion of the layers B 12 to the substrate 2. The thickness of the respective layers A is set in at least 100 nm in order to maintain a ratio of the total thicknesses between the layers A 11 and the layers B 12 in the stack. If the thickness of each layer A 11 is less than 100 nm in the second embodiment, desired effect of the layers A 11 in the stack is diluted, which prevents the excellent effect of a multilayer film on the hardness, oxidation resistance and adhesion to the substrate from being exerted. Here, it is preferable that the thickness of each layer A 11 be 3000 nm or less.

Obviously, the effect of improving the adhesion of the layer B 12 to the substrate 2 via the layer A 11 in the second embodiment is exerted by forming a layer A 11 as the bottom layer of the multilayer hard film 1, that is, as the layer located between the undermost layer of the layers B 12 and the substrate 2. If such a layer A 11 is not formed directly on the surface of the substrate 2 in the second embodiment, an extremely hard layer B 12 is to be formed directly on the surface of the substrate 2. This results in no improvement of the adhesion of the layer B 12.

Each layer B 12 of the second embodiment is formed of at least one selected from $TiB_2$, SiC, and $B_4C$ and has a thickness of at least 50 nm. That is, each layer B 12 may be formed by using one, appropriately selected two, or all of the materials described in the second embodiment.

For example, if the layer B 12 is formed of two components selected as in the second embodiment, such two components include the combination of SiC and $TiB_2$, SiC and $B_4C$, or $TiB_2$ and $B_4C$.

The layers B 12 may optionally and at least partially contain nitrogen (N). Thus, the layers B 12 may optionally be formed by using one or more components selected from TiBN, SiCN, BCN, $TiB_2$, SiC, and $B_4C$. Note the atomic ratio of N may be 0.5 or less, preferably 0.3 or less, and more preferably 0.2 or less. If the atomic ratio of N is more than 0.5, the hardness becomes lower, resulting in no elongation of the lifetime of the member 10.

For example, in the case where the layers B 12 in the multilayer hard film 1 include two types of layers B 12 respectively formed of SiC and $TiB_2$, the stack may be constructed on the surface of the substrate, by stacking a layer A 11 of TiSiN/a layer B 12 of $TiB_2$/a layer A 11 of TiSiN/a layer B 12 of SiC in this order. In the case where the layers B 12 include all the three types of layers B 12, the stack may be constructed on the surface of the substrate 2 by stacking a layer A 11 of TiSiN/a layer B 12 of $TiB_2$/a layer A 11 of TiSiN/a layer B 12 of SiC/a layer A 11 of TiSiN/a layer B 12 of $B_4C$ in this order.

Here, the layer B 12 formed of at least one selected from TiBN, SiCN, BCN, $TiB_2$, SiC and $B_4C$ has extremely high hardness (around 40 GPa). Therefore, it is possible to improve the wear resistance of the member 10 by forming the layer B 12. In order to improve the wear resistance of the member 10 with high reliability, it is preferable that the thickness of each layer B 12 of the second embodiment be at least 50 nm. If the thickness of each layer B 12 is less than 50 nm, the wear resistance of the member 10 is likely not to be improved. Here, it is preferable that the thickness of each B layer is 3000 nm or less.

Further, preferably a stack of the second embodiment is formed by alternately stacking a layer A 11 and a layer B 12 one or more times in this order over the surface of the substrate 2. Note the number of pairs of the layer A 11 and the layer B 12 is at least one. For example, two times (or total of four layers), four times (or total of eight layers), or seven times (or total of fourteen layers) may be applicable.

Figure 2:
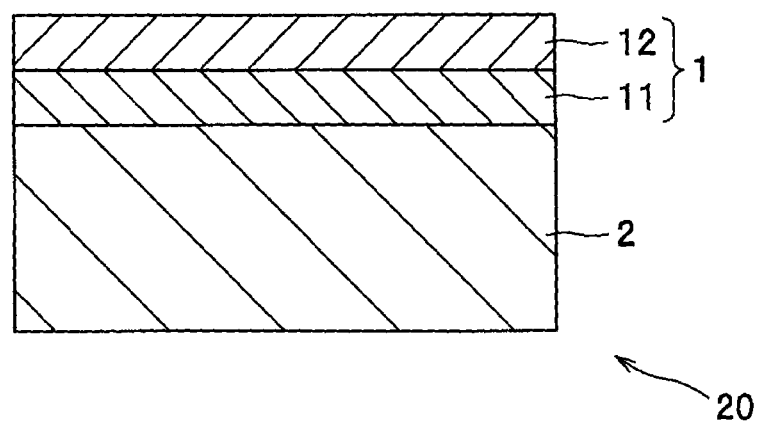
FIG. 2 is a schematic cross-sectional view of a multilayer hard film according to a third embodiment of the present invention.

A third embodiment of the present invention is illustrated in FIG. 2. Here, the multilayer hard film 1 is stacked formed of a single pair of layers A 11 and B 12 over the surface of the substrate 2. When the multilayer hard film 1 in the third embodiment has a structure as illustrated in FIG. 2, such a simple structure is capable of realizing high adhesion to the substrate 2, and elongating a lifetime of the member 20, as indicated later by Examples.

In the third embodiment shown in FIG. 2, when the single pair of layers A 11 and B 12 are formed over the surface of the substrate 2, the thickness of the layer A 11 is preferably at least 500 nm, and the thickness of the layer B 12 is preferably at least 100 nm. Herein, the multilayer hard film 1 of FIG. 2 reliably achieves both high adhesion and high oxidation resistance, which allows the lifetime of the member 20 to be elongated.

Further, in the multilayer hard films 1 according to the third embodiment, it is preferable that a combination of the layer A 11 and the layer B 12 includes a layer B 12 containing SiC or SiCN. Such a layer B 12 enables the affinity to TiSi(BCN) in the layer A 11 to be enhanced due to Si contained in the layer B 12, whereby the adhesion is further improved.

Both in the first embodiment and in the second embodiment, the total thickness of the stack formed of the layer A 11 and the layer B 12 in the multilayer hard film 1 is set in 500 nm or more, in view of the elongation of the lifetime of the member 10. If the total thickness of the stacked layers A 11 and B 12 is less than 500 nm, an total thickness of the layers exerting the wear resistant effect becomes too thin to elongate the lifetime of the member 10. The desired effect of elongating the lifetime of the members 10 and 20 is further enhanced as the total thickness of the stack formed of the layers A 11 and B 12 increases. Nevertheless, this effect diminishes, if the total thickness of the stack is beyond approximately 10 μm. Accordingly, it is preferable that the upper limit of the total thickness of the stacked layers A 11 and B 12 be approximately 5000 nm.

Figure 3:
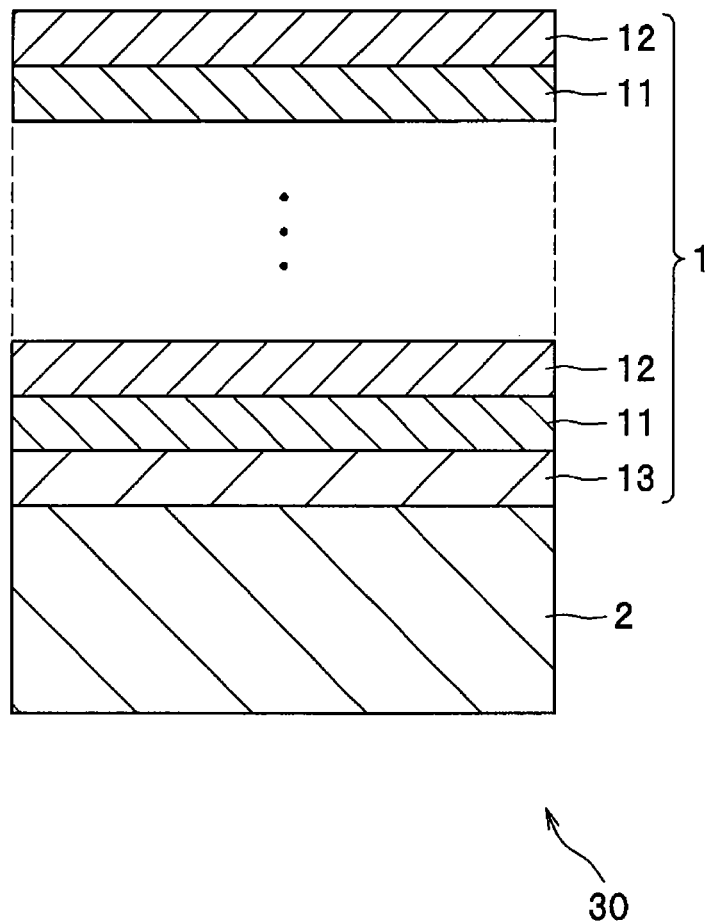
FIG. 3 is a schematic cross-sectional view of a multilayer hard film according to a fourth embodiment of the present invention.
Figure 4:
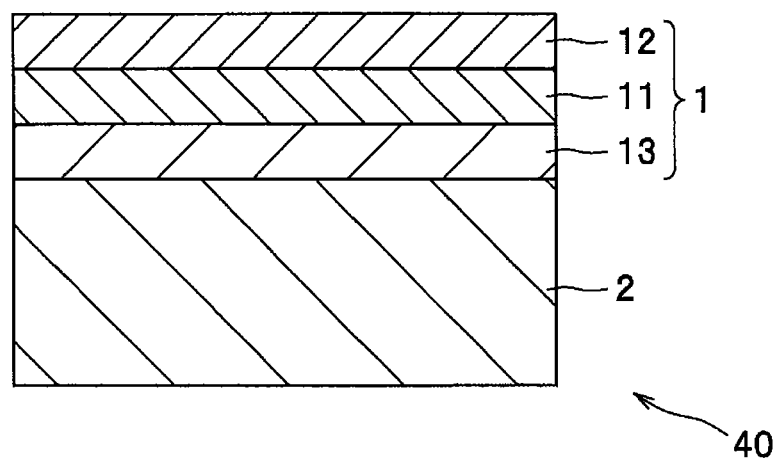
FIG. 4 is a schematic cross-sectional view of a multilayer hard film according to a fifth embodiment of the present invention.

In fourth and fifth embodiments of the present invention, preferably a predetermined underlying layer 13 is formed between the undermost layer A 11 of the multilayer hard film 1 and the substrate 2 in the member 30 or the member 40 as respectively illustrated in FIGS. 3 and 4.

In the fourth embodiment illustrated in FIG. 3, shown is a stack formed by alternately stacking a layer A 11 and a layer B 12 multi times over the surface of the substrate 2. In the fifth embodiment illustrated in FIG. 4, shown is a stack formed of only a pair of layers A 11 and B 12 over the surface of the substrate 2 similarly as shown in FIG. 2.

The underlying layer 13 may be formed of $M_{1-y}Al_y(B_aC_bN_cO_d)$, wherein $0.05 \le y \le 0.8$, $0 \le a \le 0.2$, $0 \le b \le 0.4$, $0.5 \le c \le 1$, $0 \le d \le 0.2$, and M is at least one element selected from Si, Y (yttrium), the Group 4A elements, the Group 5A elements, and the Group 6A elements of the Periodic Table.

Here, the Group 4A elements include Ti (titanium), Zr (zirconium), and Hf (hafnium). The Group 5A elements include V (vanadium), Nb (niobium), and Ta (tantalum). The Group 6A elements include Cr (chromium), Mo (molybdenum), and W (tungsten).

Preferable combinational examples of the composition of the underlying layer 13 include AlCr(CN), TiAl(CN), TiCrAl(CN), AlCrSi(CN), TiAlSi(CN), and TiCrAlSi(CN) or the like. Note the underlying layer 13 selected from the above examples is obviously formed with the atomic ratio as defined hereinbefore.

However, the composition of the underlying layer 13 is not limited to the above preferable examples, and may include, for example, one or a combination of TiAlN, TiN, AlCrN, TiCrAlN, TiAlSiN, AlCrSiN, TiCrAlSiN, NbAlN, and HfAlN.

Formation of the underlying layer 13 can further enhance the adhesion of the layers B 12 and the undermost layer made of a layer A 11 to the substrate 2, whereby the adhesion of the multilayer hard film 1 is further enhanced. Herein, in view of the properties such as hardness and oxidation resistance of the underlying layer 13, it is preferable that the atomic ratio "y" of Al (aluminum) in $M_{1-y}Al_y$ be 0.05 to 0.8, preferably 0.1 to 0.6. If the atomic ratio "y" of Al in $M_{1-y}Al_y$ is outside of the range of from 0.05 to 0.8, the hardness and oxidation resistance is less than $M_{1-y}Al_y$ having the atomic ratio "y" within the above preferable range. This results in little elongation of the lifetime of the member. Therefore, when the atomic ratio "y" of Al in the underlying layer 13 is 0.05 to 0.8, the effect of elongating the lifetime of a member 30 or 40 can be obtained.

As indicated above, the underlying layer 13 made of $M_{1-y}Al_y(B_aC_bN_cO_d)$ basically includes a nitride of the element M, where the atomic ratio "c" of N is 0.5 to 1. The underlying layer 13 can optionally further contain B, C and O, where the atomic ratio "a" of B may be 0 to 0.2, the atomic ratio "b" of C is 0 to 0.4, and the atomic ratio "d" of O (oxygen) is 0 to 0.2. If the atomic ratios of B, C and O are respectively set in the above defined ranges, the adhesion between the undermost layer and the substrate 2 increases, thereby enhancing the adhesion between the multilayer hard film 1 and the substrate 2.

The underlying layer 13 is effective in improving the adhesion as long as the thickness of the underlying layer 13 is 50 nm or more. Preferably the thickness of the underlying layer 13 is 100 nm or more, and more preferably 500 nm or more. It is preferable that the thickness of the underlying layer 13 be 2000 nm or less.

The multilayer hard film 1 explained hereinbefore can be preferably formed by a PVD (Physical Vapor Deposition) method including sputtering, deposition, vacuum arc vaporization, ion-beam deposition etc. or the combination thereof.

Next, in another embodiment, a method for producing a multilayer hard film 1 will be described hereinafter.

The method for producing the multilayer hard film 1 of the present embodiment includes the steps of: forming a layer A (not shown), where the layer A 11 is made of $Ti_{1-x}Si_x(B_pC_qN_r)$ and $0.05 \le x \le 0.4$, $p \ge 0$, $q \ge 0$, $r > 0$; forming a layer B (not shown), where the layer B 12 is made of at least one selected from $Ti_{1-a-g-b}B_aC_gN_b$ wherein $0.05 \le a \le 0.5$, $0.25 \le b \le 0.6$, $0 \le g \le 0.5$; $Si_{1-c-d}C_cN_d$, (wherein $0.2 \le c \le 0.5$, $0.25 \le d \le 0.5$), $Si_{1-e-f}C_eN_f$, (wherein $0.03 \le e \le 0.25$, $0.3 \le f \le 0.55$), $TiB_2$, SiC and $B_4C$: and alternately stacking a layer A 11 and a layer B 12 one another over the surface of the substrate 2. Note the detailed explanation of the layers A 11 and B 12 has been explained in detail hereinbefore. The method for producing the multilayer hard film 1 of the present embodiment may be conducted by a film-formation system described hereinafter.

Figure 5:
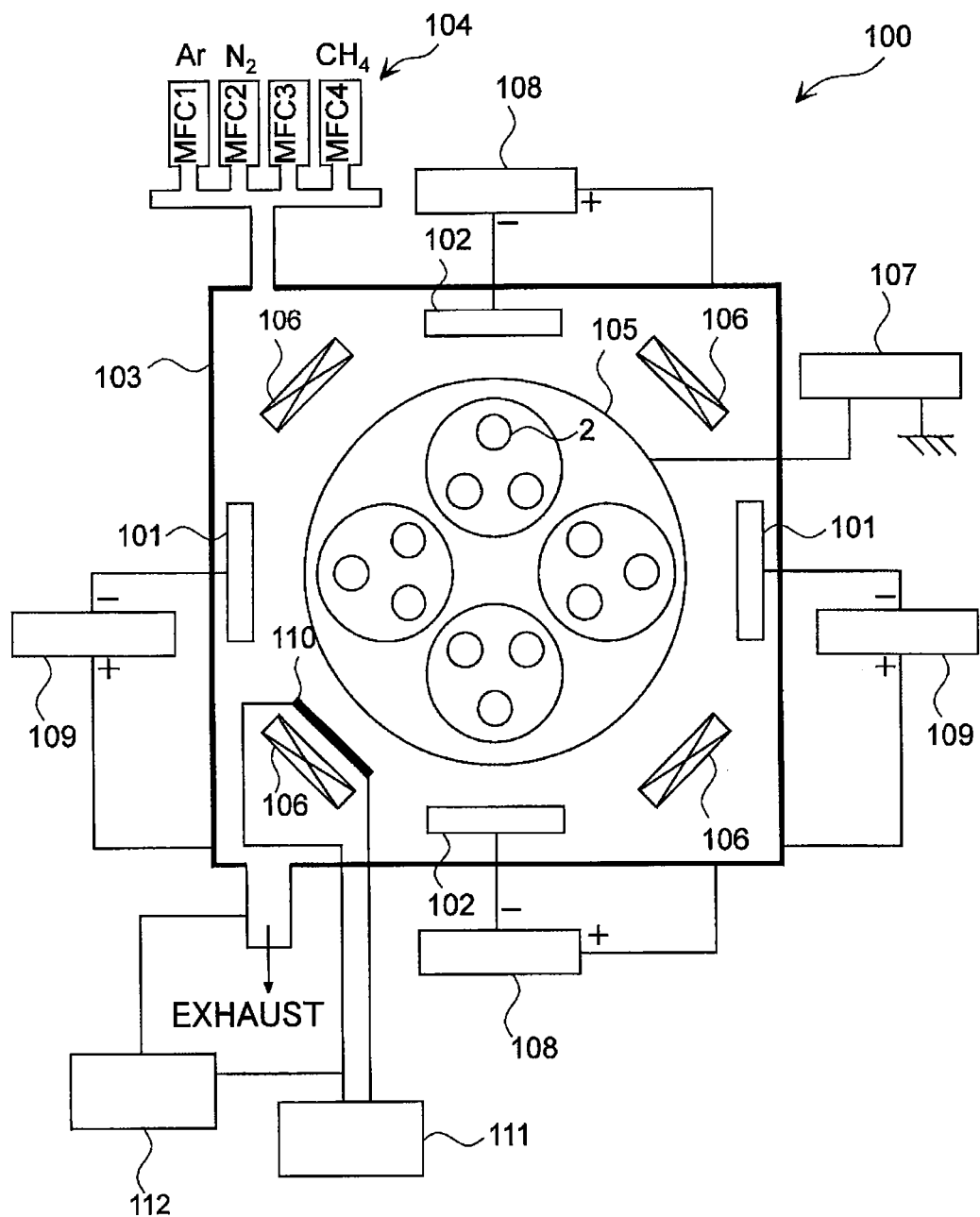
FIG. 5 is a diagram schematically illustrating a film-formation system.

The multilayer hard film 1 according to any of the embodiments of the invention can be preferably formed by a film-formation system 100 illustrated in FIG. 5. The film-formation system 100 is a composite apparatus made by combining the above mentioned vacuum arc vaporization apparatus and sputtering apparatus. The film-formation system 100 is provided with a vacuum arc vaporization source 101 equipped with a target material forming a layer A 11, and a sputtering evaporation source 102 equipped with a target material forming a layer B 12, all of which are inside a chamber 103. The film-formation system 100 conducts the steps of: rotating the substrate 2 inside the chamber 103, simultaneously making the vacuum arc vaporization source 101 and the sputtering evaporation source 102 discharge electricity at the same timing, thereby alternately stacking the layer A 11 and the layer B 12 one another over the surface of the substrate 2.

Herein, the substrate 2 can be rotated by being on a platform 105 which is rotatable inside the chamber 103.

The sputtering evaporation source 102 is called an unbalanced magnetron sputtering evaporation source and, for example, UBMS 202 (Kobe Seiko Sho) can be preferably used. As illustrated in FIG. 5, the film-formation system 100 has a pair of vacuum arc vaporization sources 101 and a pair of sputtering evaporation sources 102. However, the arrangement is not limited to the above example, and it is possible to arrange three sets of the sources 101 and 102 to be alternately located.

When the multilayer hard film 1 is formed as described above, the adhesion between the layer A 11 and the layer B 12 can be increased. In that process, after the layer A 11 has been formed by discharge of the vacuum arc vaporization sources 101 with rotating the substrate 2, the discharge of the vacuum arc vaporization sources 101 is terminated. Then, the layer B 12 is formed by discharge of the sputtering evaporation source 102. This process allows the layers A 11 and B 12 to be alternately stacked. Note the discharge of the vacuum arc vaporization sources 101 and the sputtering evaporation sources 102 may be simultaneously performed when the layer A 11 and the layer B 12 are formed.

As illustrated in FIG. 5, the film-formation system 100 is provided with a vacuum pump (not shown), a gas supply mechanism 104, a platform 105, a heater 106, a bias power supply 107, sputtering power supplies 108, and arc power supplies 109.

The gas supply mechanism 104 supplies gas such as Ar, $N_2$, or $CH_4$ to the chamber 103 in the film-formation system 100 corresponding to a film-formation process thus executed. Note MFC1-MFC4 in FIG. 5 are mass flow meters. The vacuum pump (not shown) controls a vacuum level inside the chamber 103 at a necessary degree. The substrates 2, on which a stack of the layers A 11 and B layers 12 is to be formed, are placed on the platform 105, and then heated by the heaters 106.

One or more target materials selected from the group of, for example, $TiB_2$, SiC and $B_4C$ are set in one of the sputtering evaporation sources 102 for forming the layer B 12, and the same or the different target materials selected from the above group are set in the other sputtering evaporation source 102.

A target material for forming the layer A 11 or a target material for forming the underlying layer 13 in the case where the underlying layer 13 is formed is set in the vacuum arc vaporization sources 101.

For example, a target material selected from any one of $Ti_{0.8}Si_{0.2}$, $Ti_{0.95}Si_{0.05}$, $Ti_{0.9}Si_{0.1}$, $Ti_{0.7}Si_{0.3}$, $Ti_{0.6}Si_{0.4}$, and $Ti_{0.7}Si_{0.2}B_{0.1}$ is set in one of the arc-ion-plating evaporation sources 101.

Further, a target material selected from any one of $Ti_{0.5}Al_{0.5}$, Ti, $Ti_{0.9}Al_{0.1}$, $Ti_{0.1}Al_{0.9}$, $Al_{0.5}Cr_{0.5}$, $Ti_{0.2}Cr_{0.2}Al_{0.6}$, $Ti_{0.5}Al_{0.47}Si_{0.03}$, $Al_{0.45}Cr_{0.5}Si_{0.05}$, $Ti_{0.2}Cr_{0.2}Al_{0.55}Si_{0.05}$, $Nb_{0.5}Al_{0.5}$, $Hf_{0.7}Al_{0.3}$, and $(Ti_{0.5}Al_{0.5})C$ is set in the other vacuum arc vaporization source 101.

The bias power supply 107 applies a bias voltage to the platform 105, so that the bias voltage is applied to the substrates 2 placed on the platform 105. The sputtering power supplies 108 control the potentials of the sputtering evaporation sources 102 so that atoms, ions, or clusters are generated from the sputtering evaporation sources 102. Further, the arc power supplies 109 control the potentials of the vacuum arc vaporization sources 101 so that atoms, ions, or clusters are generated from the vacuum arc vaporization sources 101.

In the above embodiment, the film-formation system 100 is further provided with a filament-type ion source 110, an AC (Alternating Current) power supply 111 for heating the filament-type ion source 110, and a DC (Direct Current) power supply 112 for discharge of the ion source 110. Alternatively, it is possible to form the multilayer hard film 1 without using the filament-type ion source 110.

In the formation of the layers A 11, B 12 and/or the underlying layer 13, C and/or N element can be introduced into the above described layers by decomposition of gas such as $N_2$ or $CH_4$ supplied from the gas supply mechanism 104.

The multilayer hard film 1 according to the present invention is formed on a surface of a substrate 2 of the members included in slide members over which other members are to slide, for example, jigs, tools, mechanical components such as dies for molding and punches and metal cutting tools each requiring the wear resistance. Such a multilayer hard film 1 is excellent in the adhesion to the substrate 2, the hardness, and the oxidation resistance. Accordingly, the integrated effects of the thickness of the stacked layers A and layers B in the multilayer hard film, the thickness of the multilayer hard film, the composition of the underlying layer combined with the thickness of the underlying layer enable the lifetime of the members 10, 20, 30 and 40 to be elongated.

EXAMPLES

Hereinafter, Examples of the present invention will be more specifically explained by indicating the effects demonstrated in the Examples.

Example A

In Example A, various films that are described below were formed on surfaces of substrates. Some of the substrates were made of a mirror-finished alloy with ultrahardness (JIS-P series), and other substrates were made of an insert of an ultrahard alloy (ADCT 1505 PDFR-HM grade IC28, ISCAR Ltd.). A film formed on the former substrate was used for evaluation of the hardness, and a film formed on the latter substrate was used for evaluation of the tool lifetime.

The films were formed on the surfaces of the substrates by a film-formation system including a plurality of vacuum arc vaporization sources (having diameters of 100 mmφ; referred to as "AIP evaporation sources" hereinafter) and a plurality of evaporation sources for sputtering (having diameters of 6 inchesφ; referred to as "SP evaporation sources" hereinafter). Target materials for forming the underlying layer and/or target materials for forming the layer A were attached to the AIP evaporation sources of the film-formation system by combining materials shown by the conditions of Nos. A1-A73 in Tables 1-3. Further, target materials for forming the layer B were attached to the SP evaporation sources of the film-formation system by combining materials shown by the conditions of Nos. A1-A73 in Tables 1-3. Note the AIP evaporation source for forming the layer A and the sputtering evaporation source for forming the layer B were alternately arranged one another so as to form the multilayer hard films.

Then, the underlying layer and the layers A and B were formed in the conditions of the thicknesses (nm), the number of stacked layers A and B, and the total thickness of the layers A and b thus stacked, as indicated in Tables 4-6. Note the mark of "-" in Tables 1-3 means that target materials were not attached, and the mark of "-" in Tables 4-6 means that no layers were formed. Further, the films were formed by the film-formation system having three sputtering evaporation sources under the conditions of Nos. A48, A66, A72 and A73.

TABLE 1

| No. | Target Material for Underlying Layer | Target Material for Layer A | Target Material for Layer B | Target Material for Layer B | Target Material for Layer B |
|---|---|---|---|---|---|
| A1 | $Ti_{0.5}Al_{0.5}$ | — | — | — | — |
| A2 | — | — | $TiB_2$ | $TiB_2$ | — |
| A3 | — | — | $B_4C$ | $B_4C$ | — |
| A4 | — | — | SiC | SiC | — |
| A5 | — | $Ti_{0.8}Si_{0.2}$ | — | — | — |
| A6 | — | Ti | SiC | SiC | — |
| A7 | — | $Ti_{0.95}Si_{0.05}$ | SiC | SiC | — |
| A8 | — | $Ti_{0.9}Si_{0.1}$ | SiC | SiC | — |
| A9 | — | $Ti_{0.8}Si_{0.2}$ | SiC | SiC | — |
| A10 | — | $Ti_{0.7}Si_{0.3}$ | SiC | SiC | — |
| A11 | — | $Ti_{0.6}Si_{0.4}$ | SiC | SiC | — |
| A12 | — | $Ti_{0.5}Si_{0.5}$ | SiC | SiC | — |
| A13 | — | $Ti_{0.7}Si_{0.2}B_{0.1}$ | SiC | SiC | — |
| A14 | — | $Ti_{0.6}Si_{0.1}B_{0.3}$ | SiC | SiC | — |
| A15 | — | $Ti_{0.8}Si_{0.2}$ | SiC | SiC | — |
| A16 | — | $Ti_{0.8}Si_{0.2}$ | SiC | SiC | — |
| A17 | — | $Ti_{0.7}Si_{0.2}B_{0.1}$ | SiC | SiC | — |
| A18 | — | $Ti_{0.8}Si_{0.2}$ | SiC | SiC | — |

TABLE 1-continued

| No. | Target Material for Underlying Layer | Target Material for Layer A | Target Material for Layer B | Target Material for Layer B | Target Material for Layer B |
|---|---|---|---|---|---|
| A19 | — | $Ti_{0.8}Si_{0.2}$ | SiC | SiC | — |
| A20 | — | $Ti_{0.8}Si_{0.2}$ | SiC | SiC | — |
| A21 | — | $Ti_{0.8}Si_{0.2}$ | SiC | SiC | — |
| A22 | — | $Ti_{0.8}Si_{0.2}$ | SiC | SiC | — |
| A23 | — | $Ti_{0.8}Si_{0.2}$ | SiC | SiC | — |
| A24 | — | $Ti_{0.8}Si_{0.2}$ | SiC | SiC | — |
| A25 | — | $Ti_{0.8}Si_{0.2}$ | SiC | SiC | — |

TABLE 2

| No. | Target Material for Underlying Layer | Target Material for Layer A | Target Material for Layer B | Target Material for Layer B | Target Material for Layer B |
|---|---|---|---|---|---|
| A26 | — | $Ti_{0.8}Si_{0.2}$ | $TiB_2$ | $TiB_2$ | — |
| A27 | — | $Ti_{0.8}Si_{0.2}$ | $TiB_2$ | $TiB_2$ | — |
| A28 | — | $Ti_{0.8}Si_{0.2}$ | $TiB_2$ | $TiB_2$ | — |
| A29 | — | $Ti_{0.8}Si_{0.2}$ | $TiB_2$ | $TiB_2$ | — |
| A30 | — | $Ti_{0.8}Si_{0.2}$ | $TiB_2$ | $TiB_2$ | — |
| A31 | — | $Ti_{0.8}Si_{0.2}$ | $TiB_2$ | $TiB_2$ | — |
| A32 | — | $Ti_{0.8}Si_{0.2}$ | $TiB_2$ | $TiB_2$ | — |
| A33 | — | $Ti_{0.8}Si_{0.2}$ | $TiB_2$ | $TiB_2$ | — |
| A34 | — | $Ti_{0.8}Si_{0.2}$ | SiC | SiC | — |
| A35 | — | $Ti_{0.8}Si_{0.2}$ | SiC | SiC | — |
| A36 | — | $Ti_{0.8}Si_{0.2}$ | SiC | SiC | — |
| A37 | — | $Ti_{0.8}Si_{0.2}$ | SiC | SiC | — |
| A38 | — | $Ti_{0.8}Si_{0.2}$ | SiC | SiC | — |
| A39 | — | $Ti_{0.8}Si_{0.2}$ | SiC | SiC | — |
| A40 | — | $Ti_{0.8}Si_{0.2}$ | $B_4C$ | $B_4C$ | — |
| A41 | — | $Ti_{0.8}Si_{0.2}$ | $B_4C$ | $B_4C$ | — |
| A42 | — | $Ti_{0.8}Si_{0.2}$ | $B_4C$ | $B_4C$ | — |
| A43 | — | $Ti_{0.8}Si_{0.2}$ | $B_4C$ | $B_4C$ | — |
| A44 | — | $Ti_{0.8}Si_{0.2}$ | $B_4C$ | $B_4C$ | — |
| A45 | — | $Ti_{0.8}Si_{0.2}$ | $B_4C$ | $B_4C$ | — |
| A46 | — | $Ti_{0.8}Si_{0.2}$ | $TiB_2$ | $B_4C$ | — |
| A47 | — | $Ti_{0.8}Si_{0.2}$ | $B_4C$ | SiC | — |
| A48 | — | $Ti_{0.8}Si_{0.2}$ | SiC | $TiB_2$ | SiC |
| A49 | $Ti_{0.5}Al_{0.5}$ | $Ti_{0.8}Si_{0.2}$ | SiC | SiC | — |
| A50 | $Ti_{0.5}Al_{0.5}$ | $Ti_{0.8}Si_{0.2}$ | SiC | SiC | — |

TABLE 3

| No. | Target Material for Underlying Layer | Target Material for Layer A | Target Material for Layer B | Target Material for Layer B | Target Material for Layer B |
|---|---|---|---|---|---|
| A51 | $Ti_{0.5}Al_{0.5}$ | $Ti_{0.8}Si_{0.2}$ | SiC | SiC | — |
| A52 | Ti | $Ti_{0.8}Si_{0.2}$ | SiC | SiC | — |
| A53 | $Ti_{0.9}Al_{0.1}$ | $Ti_{0.8}Si_{0.2}$ | SiC | SiC | — |
| A54 | $Ti_{0.1}Al_{0.9}$ | $Ti_{0.8}Si_{0.2}$ | SiC | SiC | — |
| A55 | $Al_{0.5}Cr_{0.5}$ | $Ti_{0.8}Si_{0.2}$ | SiC | SiC | — |
| A56 | $Ti_{0.2}Cr_{0.2}Al_{0.6}$ | $Ti_{0.8}Si_{0.2}$ | SiC | SiC | — |
| A57 | $Ti_{0.5}Al_{0.47}Si_{0.03}$ | $Ti_{0.8}Si_{0.2}$ | SiC | SiC | — |
| A58 | $Al_{0.45}Cr_{0.5}Si_{0.05}$ | $Ti_{0.8}Si_{0.2}$ | SiC | SiC | — |
| A59 | $Ti_{0.2}Cr_{0.2}Al_{0.55}Si_{0.05}$ | $Ti_{0.8}Si_{0.2}$ | SiC | SiC | — |
| A60 | $Nb_{0.5}Al_{0.5}$ | $Ti_{0.8}Si_{0.2}$ | SiC | SiC | — |
| A61 | $Hf_{0.7}Al_{0.3}$ | $Ti_{0.8}Si_{0.2}$ | SiC | SiC | — |
| A62 | $Ti_{0.5}Al_{0.5}$ | $Ti_{0.8}Si_{0.2}$ | SiC | SiC | — |
| A63 | $Ti_{0.5}Al_{0.5}$ | $Ti_{0.8}Si_{0.2}$ | SiC | $TiB_2$ | — |
| A64 | $Ti_{0.5}Al_{0.5}$ | $Ti_{0.8}Si_{0.2}$ | $TiB_2$ | $B_4C$ | — |
| A65 | $Ti_{0.5}Al_{0.5}$ | $Ti_{0.8}Si_{0.2}$ | $B_4C$ | SiC | — |
| A66 | $Ti_{0.2}Cr_{0.2}Al_{0.6}$ | $Ti_{0.8}Si_{0.2}$ | SiC | $TiB_2$ | SiC |
| A67 | $Ti_{0.2}Cr_{0.2}Al_{0.6}$ | $Ti_{0.8}Si_{0.2}$ | SiC | SiC | — |
| A68 | $Ti_{0.2}Cr_{0.2}Al_{0.6}$ | $Ti_{0.8}Si_{0.2}$ | SiC | SiC | — |
| A69 | $Ti_{0.2}Cr_{0.2}Al_{0.6}$ | $Ti_{0.8}Si_{0.2}$ | SiC | SiC | — |
| A70 | $Ti_{0.2}Cr_{0.2}Al_{0.6}$ | $Ti_{0.8}Si_{0.2}$ | SiC | SiC | — |
| A71 | $Ti_{0.2}Cr_{0.2}Al_{0.6}$ | $Ti_{0.8}Si_{0.2}$ | SiC | SiC | — |
| A72 | — | $Ti_{0.8}Si_{0.2}$ | SiC | $TiB_2$ | SiC |
| A73 | $Ti_{0.2}Cr_{0.2}Al_{0.6}$ | $Ti_{0.8}Si_{0.2}$ | SiC | $TiB_2$ | SiC |

TABLE 4

| No. | Underlying Layer | Thickness (nm) | Layer A | Thickness (nm) | Layer B | Thickness (nm) | The Number of Pairs of Layers A & B | Overall Thickness of Layers A & B (nm) |
|---|---|---|---|---|---|---|---|---|
| A1 | Ti0.5Al0.5N | 4000 | — | — | — | — | — | 0 |
| A2 | — | — | — | — | Ti0.2B0.4N0.4 | 2000 | 1 | 2000 |
| A3 | — | — | — | — | B0.45C0.1N0.45 | 2000 | 1 | 2000 |
| A4 | — | — | — | — | Si0.3C0.3N0.4 | 2000 | 1 | 2000 |
| A5 | — | — | Ti0.8Si0.2N | 2000 | — | — | 1 | 2000 |
| A6 | — | — | TiN | 15 | Si0.3C0.3N0.4 | 5 | 150 | 3000 |
| A7 | — | — | Ti0.95Si0.05N | 15 | Si0.3C0.3N0.4 | 5 | 150 | 3000 |
| A8 | — | — | Ti0.9Si0.1N | 15 | Si0.3C0.3N0.4 | 5 | 150 | 3000 |
| A9 | — | — | Ti0.8Si0.2N | 15 | Si0.3C0.3N0.4 | 5 | 150 | 3000 |
| A10 | — | — | Ti0.7Si0.3N | 15 | Si0.3C0.3N0.4 | 5 | 150 | 3000 |
| A11 | — | — | Ti0.6Si0.4N | 15 | Si0.3C0.3N0.4 | 5 | 150 | 3000 |
| A12 | — | — | Ti0.5Si0.5N | 15 | Si0.3C0.3N0.4 | 5 | 150 | 3000 |
| A13 | — | — | Ti0.8Si0.2(B0.1N0.9) | 15 | Si0.3C0.3N0.4 | 5 | 150 | 3000 |
| A14 | — | — | Ti0.8Si0.2(B0.3N0.7) | 15 | Si0.3C0.3N0.4 | 5 | 150 | 3000 |
| A15 | — | — | Ti0.8Si0.2(C0.2N0.8) | 15 | Si0.3C0.3N0.4 | 5 | 150 | 3000 |
| A16 | — | — | Ti0.8Si0.2(C0.6N0.4) | 15 | Si0.3C0.3N0.4 | 5 | 150 | 3000 |
| A17 | — | — | Ti0.8Si0.2(B0.1C0.1N0.8) | 15 | Si0.3C0.3N0.4 | 5 | 150 | 3000 |
| A18 | — | — | Ti0.8Si0.2N | 10 | Si0.3C0.3N0.4 | 5 | 200 | 3000 |
| A19 | — | — | Ti0.8Si0.2N | 50 | Si0.3C0.3N0.4 | 5 | 54 | 3000 |
| A20 | — | — | Ti0.8Si0.2N | 100 | Si0.3C0.3N0.4 | 5 | 28 | 3000 |
| A21 | — | — | Ti0.8Si0.2N | 200 | Si0.3C0.3N0.4 | 5 | 14 | 3000 |
| A22 | — | — | Ti0.8Si0.2N | 10 | Si0.3C0.3N0.4 | 1 | 272 | 3000 |
| A23 | — | — | Ti0.8Si0.2N | 10 | Si0.3C0.3N0.4 | 5 | 200 | 3000 |
| A24 | — | — | Ti0.8Si0.2N | 10 | Si0.3C0.3N0.4 | 20 | 100 | 3000 |
| A25 | — | — | Ti0.8Si0.2N | 10 | Si0.3C0.3N0.4 | 30 | 75 | 3000 |

TABLE 5

| No. | Underlying Layer | Thickness (nm) | Layer A | Thickness (nm) | Layer B | Thickness (nm) | The Number of Pairs of Layers A & B | Overall Thickness of Layers A & B (nm) |
|---|---|---|---|---|---|---|---|---|
| A26 | — | — | Ti0.8Si0.2N | 15 | Ti0.4B0.1N0.5 | 4 | 157 | 3000 |
| A27 | — | — | Ti0.8Si0.2N | 15 | Ti0.2B0.3N0.5 | 4 | 157 | 3000 |
| A28 | — | — | Ti0.8Si0.2N | 15 | Ti0.1B0.6N0.3 | 4 | 157 | 3000 |
| A29 | — | — | Ti0.8Si0.2N | 15 | Ti0.4B0.4N0.2 | 4 | 157 | 3000 |
| A30 | — | — | Ti0.8Si0.2N | 15 | Ti0.2B0.35N0.45 | 4 | 157 | 3000 |
| A31 | — | — | Ti0.8Si0.2N | 15 | Ti0.2B0.15C0.2N0.45 | 4 | 157 | 3000 |
| A32 | — | — | Ti0.8Si0.2N | 15 | Ti0.2B0.1C0.6N0.1 | 4 | 157 | 3000 |
| A33 | — | — | Ti0.8Si0.2N | 15 | Ti0.1B0.2N0.7 | 4 | 157 | 3000 |
| A34 | — | — | Ti0.8Si0.2N | 15 | Si0.4C0.1N0.5 | 4 | 157 | 3000 |
| A35 | — | — | Ti0.8Si0.2N | 15 | Si0.3C0.3N0.4 | 4 | 157 | 3000 |
| A36 | — | — | Ti0.8Si0.2N | 15 | Si0.2C0.6N0.2 | 4 | 157 | 3000 |
| A37 | — | — | Ti0.8Si0.2N | 15 | Si0.4C0.4N0.2 | 4 | 157 | 3000 |
| A38 | — | — | Ti0.8Si0.2N | 15 | Si0.3C0.3N0.4 | 4 | 157 | 3000 |
| A39 | — | — | Ti0.8Si0.2N | 15 | Si0.2C0.2N0.6 | 4 | 157 | 3000 |
| A40 | — | — | Ti0.8Si0.2N | 15 | B0.5N0.5 | 4 | 157 | 3000 |
| A41 | — | — | Ti0.8Si0.2N | 15 | B0.45C0.1N0.45 | 4 | 157 | 3000 |
| A42 | — | — | Ti0.8Si0.2N | 15 | B0.35C0.3N0.35 | 4 | 157 | 3000 |
| A43 | — | — | Ti0.8Si0.2N | 15 | B0.7C0.1N0.2 | 4 | 157 | 3000 |
| A44 | — | — | Ti0.8Si0.2N | 15 | B0.45C0.1N0.45 | 4 | 157 | 3000 |
| A45 | — | — | Ti0.8Si0.2N | 15 | B0.2C0.2N0.6 | 4 | 157 | 3000 |
| A46 | — | — | Ti0.8Si0.2N | 15 | Ti0.2B0.4N0.4/B0.45C0.1N0.45 | 4 | 157 | 3000 |
| A47 | — | — | Ti0.8Si0.2N | 15 | B0.45C0.1N0.45/Si0.3C0.3N0.4 | 4 | 157 | 3000 |
| A48 | — | — | Ti0.8Si0.2N | 15 | Si0.3C0.3N0.4/Ti0.2B0.4N0.4/B0.45C0.1N0.45 | 4 | 157 | 3000 |
| A49 | Ti0.5Al0.5N | 50 | Ti0.8Si0.2N | 15 | Si0.3C0.3N0.4 | 4 | 157 | 3000 |
| A50 | Ti0.5Al0.5N | 500 | Ti0.8Si0.2N | 15 | Si0.3C0.3N0.4 | 4 | 157 | 3000 |

TABLE 6

| No. | Underlying Layer | Thickness (nm) | Layer A | Thickness (nm) | Layer B | Thickness (nm) | The Number of Pairs of Layers A & B | Overall Thickness of Layers A & B (nm) |
|---|---|---|---|---|---|---|---|---|
| A51 | Ti0.5Al0.5N | 2000 | Ti0.8Si0.2N | 15 | Si0.3C0.3N0.4 | 4 | 157 | 3000 |
| A52 | TiN | 1000 | Ti0.8Si0.2N | 15 | Si0.3C0.3N0.4 | 4 | 157 | 3000 |
| A53 | Ti0.9Al0.1N | 1000 | Ti0.8Si0.2N | 15 | Si0.3C0.3N0.4 | 4 | 157 | 3000 |
| A54 | Ti0.1Al0.9N | 1000 | Ti0.8Si0.2N | 15 | Si0.3C0.3N0.4 | 4 | 157 | 3000 |
| A55 | Al0.5Cr0.5N | 1000 | Ti0.8Si0.2N | 15 | Si0.3C0.3N0.4 | 4 | 157 | 3000 |
| A56 | Ti0.2Cr0.2Al0.6N | 1000 | Ti0.8Si0.2N | 15 | Si0.3C0.3N0.4 | 4 | 157 | 3000 |
| A57 | Ti0.5Al0.47Si0.03N | 1000 | Ti0.8Si0.2N | 15 | Si0.3C0.3N0.4 | 4 | 157 | 3000 |
| A58 | Al0.45Cr0.5Si0.05N | 1000 | Ti0.8Si0.2N | 15 | Si0.3C0.3N0.4 | 4 | 157 | 3000 |
| A59 | Ti0.2Cr0.2Al0.55Si0.05N | 1000 | Ti0.8Si0.2N | 15 | Si0.3C0.3N0.4 | 4 | 157 | 3000 |
| A60 | Nb0.5Al0.5N | 1000 | Ti0.8Si0.2N | 15 | Si0.3C0.3N0.4 | 4 | 157 | 3000 |
| A61 | Hf0.7Al0.3N | 1000 | Ti0.8Si0.2N | 15 | Si0.3C0.3N0.4 | 4 | 157 | 3000 |
| A62 | (Ti0.5Al0.5)C0.2N0.8 | 500 | Ti0.8Si0.2N | 15 | Si0.3C0.3N0.4 | 4 | 157 | 3000 |
| A63 | Ti0.5Al0.5N | 2000 | Ti0.8Si0.2N | 15 | Si0.3C0.3N0.4/Ti0.2B0.4N0.4 | 4 | 157 | 3000 |
| A64 | Ti0.5Al0.5N | 2000 | Ti0.8Si0.2N | 15 | Ti0.2B0.4N0.4/B0.45C0.1N0.45 | 4 | 157 | 3000 |
| A65 | Ti0.5Al0.5N | 2000 | Ti0.8Si0.2N | 15 | B0.45C0.1N0.45/Si0.3C0.3N0.4 | 4 | 157 | 3000 |
| A66 | Ti0.2Cr0.2Al0.6N | 1000 | Ti0.8Si0.2N | 15 | Si0.3C0.3N0.4/Ti0.2B0.4N0.4/B0.45C0.1N0.45 | 4 | 157 | 3000 |
| A67 | Ti0.2Cr0.2Al0.6N | 1000 | Ti0.8Si0.2N | 15 | Si0.3C0.3N0.4 | 4 | 15 | 300 |
| A68 | Ti0.2Cr0.2Al0.6N | 1000 | Ti0.8Si0.2N | 15 | Si0.3C0.3N0.4 | 4 | 263 | 5000 |
| A69 | Ti0.2Cr0.2Al0.6N | 1000 | Ti0.8Si0.2N | 15 | Si0.3C0.3N0.4 | 4 | 26 | 500 |
| A70 | Ti0.2Cr0.2Al0.6N | 1000 | Ti0.8Si0.2N | 15 | Si0.3C0.3N0.4 | 4 | 52 | 1000 |
| A71 | Ti0.2Cr0.2Al0.6N | 1000 | Ti0.8Si0.2N | 15 | Si0.3C0.3N0.4 | 4 | 105 | 2000 |
| A72 | — | — | Ti0.8Si0.2N | 15 | Si0.3C0.3N0.4/Ti0.2B0.4N0.4/B0.45C0.1N0.45 | 6 | 157 | 3000 |
| A73 | Ti0.2Cr0.2Al0.6N | 1000 | Ti0.8Si0.2N | 15 | Si0.3C0.3N0.4/Ti0.2B0.4N0.4/B0.45C0.1N0.45 | 6 | 157 | 3000 |

Specifically, the layers in each of the films were formed in the following process.

First, after a cleaned substrate was introduced into the composite film-formation system, a chamber was evacuated to the vacuum of $1 \times 10^{-3}$ Pa or lower, and then the substrate was heated to 500° C. Thereafter, Ar (argon) ion sputter cleaning was performed. Then, $N_2$ gas was introduced into the chamber to set the pressure inside the chamber at 4 Pa.

In the above environment, some of the films were formed with the underlying layer, and subsequently the stack was formed by alternately stacking a layer A and a layer B one another in the conditions indicated in Tables 4-6 and some of the films were formed by alternately stacking a layer A and a layer B one another directly onto the substrate without the underlying layer in the conditions indicated in Tables 4-6.

During the formation of the underlying layer, an arc discharge with the current of 150 A was performed in the $N_2$ atmosphere (Note a small amount of $CH_4$ gas was additionally introduced under the condition of No. A62).

Thereafter, Ar gas and $N_2$ gas were introduced into the chamber at the flow ratio of 1:1 (Note a small amount of $CH_4$ gas was additionally introduced under the conditions of Nos. A15-A17) until the pressure in the chamber reached 4 Pa. Then, a layer A was formed with a thin thickness via conducting an arc discharge in a short period as rotating substrates placed on the platform. After that, a layer B was formed with a thin thickness via conducting a sputtering discharge with the power of 2 kW in a short period. During the formation of the layers A and B, the number of pairs of layers A and B and each thickness of the respective layers were controlled, for example, by varying the rotation speed of the substrates from approximately 1-10 rpm or varying the electric power inputted into the respective evaporation sources.

The hardness of respective ultrahard alloy-made substrates with the films prepared under the conditions of Nos. A1-A73 was evaluated. The tool lifetimes of the ultrahard alloy-made inserts with films prepared under the conditions of Nos. A1-A73 were also evaluated.

The hardness was measured by using a Vickers hardness tester with the load of 0.25 N.

Here, the tool lifetimes depend on combination of various factors including: the hardness and the oxidation resistance of each film; the thickness of each film, the overall thickness of the multilayer hard film, the adhesion of the multilayer hard film to the substrate; and the strength of the substrate. Therefore, the tool lifetimes were evaluated by a cutting test. In the cutting test, each of the ultrahard alloy-made inserts with the films was held to an end mill, and then dry-turning of a workpiece material was performed under the following conditions:

<Dry Turning Conditions>
Workpiece Material: AISI 316;
Cutting Speed: 180 m/min;
Feed: 0.14 mm/tooth;
Depth of Cut: 4.5 mm; and
Lubrication Test: dry.

Table 7 indicates the results of the hardness test and the cutting test. In Table 7, the ultrahard alloy-made insert with a film formed under the condition of No. A1 was used as a reference specimen. The tool lifetime of the reference specimen was defined as 100%, and each tool lifetime of the test samples was indicated as a relative value to the tool lifetime of the reference specimen. Accordingly, the data in Table 7 indicate that the higher the relative value becomes, the longer the tool lifetime becomes.

TABLE 7

| No. | Hardness (GPa) | Tool Lifetime (%) | Remarks |
|---|---|---|---|
| A1 | 25 | 100 | Conventional Example |
| A2 | 25 | 45 | Comparison Example |
| A3 | 23 | 40 | Comparison Example |
| A4 | 25 | 50 | Comparison Example |
| A5 | 35 | 65 | Comparison Example |

TABLE 7-continued

| No. | Hardness (GPa) | Tool Lifetime (%) | Remarks |
| --- | --- | --- | --- |
| A6 | 23 | 70 | Comparison Example |
| A7 | 32 | 145 | Concrete Example |
| A8 | 36 | 150 | Concrete Example |
| A9 | 38 | 170 | Concrete Example |
| A10 | 37 | 155 | Concrete Example |
| A11 | 36 | 145 | Concrete Example |
| A12 | 26 | 65 | Comparison Example |
| A13 | 38 | 165 | Concrete Example |
| A14 | 31 | 110 | Concrete Example |
| A15 | 37 | 160 | Concrete Example |
| A16 | 30 | 105 | Concrete Example |
| A17 | 34 | 150 | Concrete Example |
| A18 | 38 | 170 | Concrete Example |
| A19 | 35 | 155 | Concrete Example |
| A20 | 33 | 150 | Concrete Example |
| A21 | 24 | 70 | Comparison Example |
| A22 | 27 | 65 | Comparison Example |
| A23 | 38 | 170 | Concrete Example |
| A24 | 33 | 145 | Concrete Example |
| A25 | 23 | 45 | Comparison Example |
| A26 | 25 | 55 | Comparison Example |
| A27 | 38 | 180 | Concrete Example |
| A28 | 26 | 45 | Comparison Example |
| A29 | 27 | 75 | Comparison Example |
| A30 | 37 | 165 | Concrete Example |
| A31 | 37 | 165 | Concrete Example |
| A32 | 22 | 55 | Comparison Example |
| A33 | 26 | 60 | Comparison Example |
| A34 | 28 | 85 | Comparison Example |
| A35 | 38 | 180 | Concrete Example |
| A36 | 24 | 55 | Comparison Example |
| A37 | 27 | 70 | Comparison Example |
| A38 | 37 | 185 | Concrete Example |
| A39 | 25 | 65 | Comparison Example |
| A40 | 18 | 20 | Comparison Example |
| A41 | 38 | 175 | Concrete Example |
| A42 | 25 | 65 | Comparison Example |
| A43 | 26 | 60 | Comparison Example |
| A44 | 37 | 165 | Concrete Example |
| A45 | 24 | 35 | Comparison Example |
| A46 | 36 | 165 | Concrete Example |
| A47 | 35 | 170 | Concrete Example |
| A48 | 37 | 180 | Concrete Example |
| A49 | 38 | 195 | Concrete Example |
| A50 | 38 | 220 | Concrete Example |
| A51 | 38 | 220 | Concrete Example |
| A52 | 38 | 175 | Concrete Example |
| A53 | 38 | 220 | Concrete Example |
| A54 | 38 | 200 | Concrete Example |
| A55 | 38 | 210 | Concrete Example |
| A56 | 38 | 215 | Concrete Example |
| A57 | 38 | 225 | Concrete Example |
| A58 | 38 | 210 | Concrete Example |
| A59 | 38 | 230 | Concrete Example |
| A60 | 38 | 190 | Concrete Example |
| A61 | 38 | 185 | Concrete Example |
| A62 | 38 | 190 | Concrete Example |
| A63 | 38 | 210 | Concrete Example |
| A64 | 38 | 225 | Concrete Example |
| A65 | 38 | 215 | Concrete Example |
| A66 | 38 | 210 | Concrete Example |
| A67 | 38 | 80 | Comparison Example |
| A68 | 38 | 210 | Concrete Example |
| A69 | 38 | 150 | Concrete Example |
| A70 | 38 | 180 | Concrete Example |
| A71 | 38 | 190 | Concrete Example |
| A72 | 38 | 185 | Concrete Example |
| A73 | 39 | 205 | Concrete Example |

As shown in Table 7, each of the test samples prepared under the conditions of Nos. A7-A11, A13-A20, A23, A24, A27, A30, A31, A35, A38, A41, A44, A46-A66, and A68-A73 satisfied the criteria of the present invention, thereby to have the higher hardness and longer tool lifetime than the reference specimen, that is, a conventional example made under the condition of No. A1.

Particularly, the underlying layer formed on the surface of the substrate under the conditions of Nos. A49-A66, A68-A71, and A7 enables the test samples to exhibit highly superior results in the hardness and the tool lifetime. Above all, it should be noted that the underlying layers in the test samples made under the conditions of Nos. A49-A51, A53, A55-A71, and A73 are formed of the aforementioned composition $M_{1-y}Al_y(B_aC_bN_cO_d)$, where $0.05 \leq y \leq 0.8$, $0 \leq a \leq 0.2$, $0 \leq b \leq 0.4$, $0.5 \leq c \leq 1$, $0 \leq d \leq 0.2$, and M is one or more selected from Si, Y, the Group 4A elements, the Group 5A elements, and the Group 6A elements of the Periodic Table. Accordingly, this construction led to the superior hardness and elongation of the tool lifetime.

In contrast, test samples made under the conditions of Nos. A1-A6, A12, A21, A22, A25, A26, A28, A29, A32-A34, A36, A37, A39, A40, A42, A43, A45, and A67 do not fulfill at least one of the criteria of the present invention. This drawback led to the poor hardness and/or tool lifetime.

Specifically, test samples made under the conditions of Nos. A2-A4 included only layers B without forming layers A. Thus, this led to the equal or lower hardness, and shorter tool lifetimes.

The test sample made under the condition of A6 had layers A containing no Si element (that is, atomic ratio of Si=0). Thus, this led to the lower hardness and shorter tool lifetime.

A test sample made under the condition of A12 had layers A in which the atomic ratio of Si was greater than 0.4. Thus, this led to the lower hardness and shorter tool lifetime. A test sample made under the condition of A21 had layers A each of which thickness was more than 100 nm. Thus, this led to the lower hardness and shorter tool lifetime.

A test sample made under the condition of A22 had layers B each of which thickness was less than 2 nm. Thus, this led to the shorter tool lifetime than that made under the condition of A1.

A test sample made under the condition of A25 had layers B each of which thickness was more than 20 nm. Thus, this led to the lower hardness and shorter tool lifetime.

A test sample made under the condition of A26 had layers B formed of TiBN in which the atomic ratio of B was less than 0.2, and a test sample made under the condition of A28 had layers B formed of TiBN in which the atomic ratio of B was more than 0.5. Thus, both samples had the lower hardness and shorter tool lifetimes.

A test sample made under the condition of A29 had layers B formed of TiBN in which the atomic ratio of N was less than 0.25, and a test sample made under the condition of A33 had layers B formed of TiBN in which the atomic ratio of N was more than 0.6. Accordingly, both samples had the lower hardness and shorter tool lifetimes.

A test sample made under the condition of A32 had layers B formed of TiBCN in which the atomic ratio of C was more than 0.5. Thus, the sample had the lower hardness and shorter tool lifetime.

A test sample made under the condition of A34 had layers B formed of SiCN in which the atomic ratio of C was less than 0.2, and a test sample made under the condition of A36 had layers B formed of SiCN in which the atomic ratio of C was more than 0.5. Accordingly, both samples had the lower hardness and shorter tool lifetimes.

A test sample made under the condition of A37 had layers B formed of SiCN in which the atomic ratio of N was less than 0.25, and a test sample made under the condition of A39 had layers B formed of SiCN in which the atomic ratio of N was more than 0.5. Accordingly, both samples had the lower hardness and shorter tool lifetimes.

A test sample made under the condition of A40 had layers B formed of BCN containing no C (that is, the atomic ratio of C=0), and a test sample made under the condition of A42 had layers B formed of BCN in which the atomic ratio of C was more than 0.25. Accordingly, both samples had the lower hardness and shorter tool lifetimes.

A test sample made under the condition of A43 had layers B formed of BCN in which the atomic ratio of N was less than 0.3, and a test sample made under the condition of A45 had layers B formed of BCN in which the atomic ratio of N was more than 0.55. Accordingly, both samples had the lower hardness and shorter tool lifetimes.

A test sample made under the condition of A67 had layers A and B of which total thickness was less than 500 nm. Accordingly, this led to the lower shorter tool lifetime.

Example B

In Example B, various films were formed on surfaces of substrates as explained hereinafter. As substrates, used were a mirror-finished substrate made of an ultrahard alloy (JIS-P type), and an ultrahard alloy-made insert (ISCAR Ltd., ADCT 1505 PDFR-HM grade IC28). The films formed on the former substrate was used for evaluation of the adhesion strength, and the films formed on the latter substrate were used for evaluation of the tool lifetime.

A film-formation system containing a plurality of AIP evaporation sources and a plurality of SP evaporation sources was used in the formation of films on the surface of the substrates as in Example A.

That is, target materials for forming the underlying layers and/or layers A under the conditions Nos. B1-B60 shown in Tables 8 and 9 were attached to the AIP evaporation sources in the film-formation system. Further, target materials for forming layers B under the conditions of Nos. B1-B60 in Tables 8 and 9 were attached to the SP evaporation sources in the film-formation system.

Then, the underlying layers, the layers A and B were formed under the conditions of the thickness (nm) shown in Tables 10 and 11, the number of the pair of layers A and B, and the total thickness of the layers A and B. Note the mark of "—" means that the target materials were not attached in the descriptions of Tables 8 and 9, and the mark of "-" means that no layers were formed in the descriptions of Tables 10 and 11.

TABLE 8

| No. | Target Material for Underlying Layer | Target Material for Layer A | Target Material for Layer B | Target Material for Layer B | Target Material for Layer B |
|---|---|---|---|---|---|
| B1 | $Ti_{0.5}Al_{0.5}$ | — | — | — | — |
| B2 | — | — | $TiB_2$ | $TiB_2$ | — |
| B3 | — | — | $B_4C$ | $B_4C$ | — |
| B4 | — | — | SiC | SiC | — |
| B5 | — | $Ti_{0.8}Si_{0.2}$ | — | — | — |
| B6 | — | Ti | SiC | SiC | — |
| B7 | — | $Ti_{0.95}Si_{0.05}$ | SiC | SiC | — |
| B8 | — | $Ti_{0.9}Si_{0.1}$ | SiC | SiC | — |
| B9 | — | $Ti_{0.8}Si_{0.2}$ | SiC | SiC | — |
| B10 | — | $Ti_{0.7}Si_{0.3}$ | SiC | SiC | — |
| B11 | — | $Ti_{0.6}Si_{0.4}$ | SiC | SiC | — |
| B12 | — | $Ti_{0.5}Si_{0.5}$ | SiC | SiC | — |
| B13 | — | $Ti_{0.7}Si_{0.2}B_{0.1}$ | SiC | SiC | — |
| B14 | — | $Ti_{0.8}Si_{0.2}$ | SiC | SiC | — |
| B15 | — | $Ti_{0.7}Si_{0.2}B_{0.1}$ | SiC | SiC | — |
| B16 | — | $Ti_{0.8}Si_{0.2}$ | SiC | SiC | — |
| B17 | — | $Ti_{0.8}Si_{0.2}$ | SiC | SiC | — |
| B18 | — | $Ti_{0.8}Si_{0.2}$ | SiC | SiC | — |
| B19 | — | $Ti_{0.8}Si_{0.2}$ | SiC | SiC | — |
| B20 | — | $Ti_{0.8}Si_{0.2}$ | SiC | SiC | — |
| B21 | — | $Ti_{0.8}Si_{0.2}$ | SiC | SiC | — |
| B22 | — | $Ti_{0.8}Si_{0.2}$ | SiC | SiC | — |
| B23 | — | $Ti_{0.8}Si_{0.2}$ | SiC | SiC | — |
| B24 | — | $Ti_{0.8}Si_{0.2}$ | $TiB_2$ | $TiB_2$ | — |
| B25 | — | $Ti_{0.8}Si_{0.2}$ | $B_4C$ | $B_4C$ | — |
| B26 | — | $Ti_{0.8}Si_{0.2}$ | SiC | SiC | — |
| B27 | — | $Ti_{0.8}Si_{0.2}$ | $TiB_2$ | $TiB_2$ | — |
| B28 | — | $Ti_{0.8}Si_{0.2}$ | $TiB_2$ | $TiB_2$ | — |
| B29 | — | $Ti_{0.8}Si_{0.2}$ | $TiB_2$ | $TiB_2$ | — |
| B30 | — | $Ti_{0.8}Si_{0.2}$ | $TiB_2$ | $TiB_2$ | — |

TABLE 9

| No. | Target Material for Underlying Layer | Target Material for Layer A | Target Material for Layer B | Target Material for Layer B | Target Material for Layer B |
|---|---|---|---|---|---|
| B31 | — | $Ti_{0.8}Si_{0.2}$ | $TiB_2$ | SiC | — |
| B32 | — | $Ti_{0.8}Si_{0.2}$ | SiC | $TiB_2$ | $B_4C$ |
| B33 | $Ti_{0.5}Al_{0.5}$ | $Ti_{0.8}Si_{0.2}$ | SiC | SiC | — |
| B34 | $Ti_{0.5}Al_{0.5}$ | $Ti_{0.8}Si_{0.2}$ | SiC | SiC | — |
| B35 | $Ti_{0.5}Al_{0.5}$ | $Ti_{0.8}Si_{0.2}$ | SiC | SiC | — |
| B36 | Ti | $Ti_{0.8}Si_{0.2}$ | SiC | SiC | — |
| B37 | $Ti_{0.9}Al_{0.1}$ | $Ti_{0.8}Si_{0.2}$ | SiC | SiC | — |
| B38 | $Ti_{0.1}Al_{0.9}$ | $Ti_{0.8}Si_{0.2}$ | SiC | SiC | — |
| B39 | $Al_{0.5}Cr_{0.5}$ | $Ti_{0.8}Si_{0.2}$ | SiC | SiC | — |

TABLE 9-continued

| No. | Target Material for Underlying Layer | Target Material for Layer A | Target Material for Layer B | Target Material for Layer B | Target Material for Layer B |
|---|---|---|---|---|---|
| B40 | $Ti_{0.2}Cr_{0.2}Al_{0.6}$ | $Ti_{0.8}Si_{0.2}$ | SiC | SiC | — |
| B41 | $Ti_{0.5}Al_{0.47}Si_{0.03}$ | $Ti_{0.8}Si_{0.2}$ | SiC | SiC | — |
| B42 | $Al_{0.45}Cr_{0.5}Si_{0.05}$ | $Ti_{0.8}Si_{0.2}$ | SiC | SiC | — |
| B43 | $Ti_{0.2}Cr_{0.2}Al_{0.55}Si_{0.05}$ | $Ti_{0.8}Si_{0.2}$ | SiC | SiC | — |
| B44 | $Nb_{0.5}Al_{0.5}$ | $Ti_{0.8}Si_{0.2}$ | SiC | SiC | — |
| B45 | $Hf_{0.7}Al_{0.3}$ | $Ti_{0.8}Si_{0.2}$ | SiC | SiC | — |
| B46 | $Ti_{0.5}Al_{0.5}$ | $Ti_{0.8}Si_{0.2}$ | SiC | SiC | — |
| B47 | $Ti_{0.5}Al_{0.5}$ | $Ti_{0.8}Si_{0.2}$ | SiC | $TiB_2$ | — |
| B48 | $Ti_{0.5}Al_{0.5}$ | $Ti_{0.8}Si_{0.2}$ | SiC | $B_4C$ | — |
| B49 | $Ti_{0.5}Al_{0.5}$ | $Ti_{0.8}Si_{0.2}$ | $TiB_2$ | $B_4C$ | — |
| B50 | $Ti_{0.5}Al_{0.5}$ | $Ti_{0.8}Si_{0.2}$ | $TiB_2$ | $B_4C$ | — |
| B51 | $Ti_{0.2}Cr_{0.2}Al_{0.6}$ | $Ti_{0.8}Si_{0.2}$ | SiC | SiC | SiC |
| B52 | $Ti_{0.2}Cr_{0.2}Al_{0.6}$ | $Ti_{0.8}Si_{0.2}$ | SiC | SiC | — |
| B53 | $Ti_{0.2}Cr_{0.2}Al_{0.6}$ | $Ti_{0.8}Si_{0.2}$ | SiC | SiC | — |
| B54 | $Ti_{0.2}Cr_{0.2}Al_{0.6}$ | $Ti_{0.8}Si_{0.2}$ | SiC | SiC | — |
| B55 | $Ti_{0.2}Cr_{0.2}Al_{0.6}$ | $Ti_{0.8}Si_{0.2}$ | SiC | SiC | — |
| B56 | — | $Ti_{0.8}Si_{0.2}$ | SiC | SiC | — |
| B57 | — | $Ti_{0.8}Si_{0.2}$ | SiC | SiC | — |
| B58 | — | $Ti_{0.8}Si_{0.2}$ | SiC | SiC | — |
| B59 | — | $Ti_{0.8}Si_{0.2}$ | $TiB_2$ | $TiB_2$ | — |
| B60 | — | $Ti_{0.8}Si_{0.2}$ | $B_4C$ | $B_4C$ | — |

TABLE 10

| No. | Underlying Layer | Thickness (nm) | Layer A | Thickness (nm) | Layer B | Thickness (nm) | The Number of Pairs of Layers A&B | Total Thickness of Layers A&B (nm) |
|---|---|---|---|---|---|---|---|---|
| B1 | Ti0.5Al0.5 | 4000 | — | — | — | — | — | 0 |
| B2 | — | — | — | — | TiB2 | 2000 | 1 | 2000 |
| B3 | — | — | — | — | B4C | 2000 | 1 | 2000 |
| B4 | — | — | — | — | SiC | 2000 | 1 | 2000 |
| B5 | — | — | Ti0.8Si0.2N | 2000 | — | — | 1 | 2000 |
| B6 | — | — | TiN | 1500 | SiC | 500 | 1 | 2000 |
| B7 | — | — | Ti0.95Si0.05N | 1500 | SiC | 500 | 1 | 2000 |
| B8 | — | — | Ti0.9Si0.1N | 1500 | SiC | 500 | 1 | 2000 |
| B9 | — | — | Ti0.8Si0.2N | 1500 | SiC | 500 | 1 | 2000 |
| B10 | — | — | Ti0.7Si0.3N | 1500 | SiC | 500 | 1 | 2000 |
| B11 | — | — | Ti0.6Si0.4N | 1500 | SiC | 500 | 1 | 2000 |
| B12 | — | — | Ti0.5Si0.5N | 1500 | SiC | 500 | 1 | 2000 |
| B13 | — | — | Ti0.8Si0.2(B0.1N0.9) | 1500 | SiC | 500 | 1 | 2000 |
| B14 | — | — | Ti0.8Si0.2(C0.2N0.8) | 1500 | SiC | 500 | 1 | 2000 |
| B15 | — | — | Ti0.8Si0.2(B0.1C0.1N0.8) | 1500 | SiC | 500 | 1 | 2000 |
| B16 | — | — | Ti0.8Si0.2N | 50 | SiC | 1000 | 1 | 1050 |
| B17 | — | — | Ti0.8Si0.2N | 200 | SiC | 1000 | 1 | 1200 |
| B18 | — | — | Ti0.8Si0.2N | 1500 | SiC | 30 | 1 | 1530 |
| B19 | — | — | Ti0.8Si0.2N | 1500 | SiC | 60 | 1 | 1560 |
| B20 | — | — | Ti0.8Si0.2N | 200 | SiC | 100 | 1 | 300 |
| B21 | — | — | Ti0.8Si0.2N | 300 | SiC | 200 | 1 | 500 |
| B22 | — | — | Ti0.8Si0.2N | 700 | SiC | 300 | 1 | 1000 |
| B23 | — | — | Ti0.8Si0.2N | 1500 | SiC | 1000 | 1 | 2500 |
| B24 | — | — | Ti0.8Si0.2N | 1500 | TiB2 | 1000 | 1 | 2500 |
| B25 | — | — | Ti0.8Si0.2N | 1500 | B4C | 1000 | 1 | 2500 |
| B26 | — | — | SiC | 1500 | Ti0.8Si0.2N | 1000 | 1 | 2500 |
| B27 | — | — | Ti0.8Si0.2N | 200 | TiB2 | 100 | 7 | 2100 |
| B28 | — | — | Ti0.8Si0.2N | 300 | TiB2 | 200 | 4 | 2000 |
| B29 | — | — | Ti0.8Si0.2N | 550 | TiB2 | 450 | 2 | 2000 |
| B30 | — | — | Ti0.8Si0.2N | 1200 | TiB2 | 1000 | 1 | 2200 |

TABLE 11

| No. | Underlying Layer | Thickness (nm) | Layer A | Thickness (nm) | Layer B | Thickness (nm) | The Number of Pairs of Layers A&B | Total Thickness of Layers A&B (nm) |
|---|---|---|---|---|---|---|---|---|
| B31 | — | — | Ti0.8Si0.2N | 1500 | SiC/TiB2 | 1000 | 1 | 2500 |
| B32 | — | — | Ti0.8Si0.2N | 1500 | SiC/TiB2/B4C | 1000 | 1 | 2500 |
| B33 | Ti0.5Al0.5N | 50 | Ti0.8Si0.2N | 1500 | SiC | 1000 | 1 | 2500 |
| B34 | Ti0.5Al0.5N | 500 | Ti0.8Si0.2N | 1500 | SiC | 1000 | 1 | 2500 |
| B35 | Ti0.5Al0.5N | 2000 | Ti0.8Si0.2N | 1500 | SiC | 1000 | 1 | 2500 |
| B36 | TiN | 1000 | Ti0.8Si0.2N | 1500 | SiC | 1000 | 1 | 2500 |
| B37 | Ti0.9Al0.1N | 1000 | Ti0.8Si0.2N | 1500 | SiC | 1000 | 1 | 2500 |
| B38 | Ti0.1Al0.9N | 1000 | Ti0.8Si0.2N | 1500 | SiC | 1000 | 1 | 2500 |
| B39 | Al0.5Cr0.5N | 1000 | Ti0.8Si0.2N | 1500 | SiC | 1000 | 1 | 2500 |
| B40 | Ti0.2Cr0.2Al0.6N | 1000 | Ti0.8Si0.2N | 1500 | SiC | 1000 | 1 | 2500 |
| B41 | Ti0.5Al0.47Si0.03N | 1000 | Ti0.8Si0.2N | 1500 | SiC | 1000 | 1 | 2500 |
| B42 | Al0.45Cr0.5Si0.05N | 1000 | Ti0.8Si0.2N | 1500 | SiC | 1000 | 1 | 2500 |
| B43 | Ti0.2Cr0.2Al0.55Si0.05N | 1000 | Ti0.8Si0.2N | 1500 | SiC | 1000 | 1 | 2500 |
| B44 | Nb0.5Al0.5N | 1000 | Ti0.8Si0.2N | 1500 | SiC | 1000 | 1 | 2500 |
| B45 | Hf0.7Al0.3N | 1000 | Ti0.8Si0.2N | 1500 | SiC | 1000 | 1 | 2500 |
| B46 | (Ti0.5Al0.5)C0.2N0.8 | 500 | Ti0.8Si0.2N | 1500 | SiC | 1000 | 1 | 2500 |
| B47 | Ti0.5Al0.5N | 2000 | Ti0.8Si0.2N | 1500 | SiC/TiB2 | 1000 | 1 | 2500 |
| B48 | Ti0.5Al0.5N | 2000 | Ti0.8Si0.2N | 1500 | SiC/B4C | 1000 | 1 | 2500 |
| B49 | Ti0.5Al0.5N | 2000 | Ti0.8Si0.2N | 1500 | TiB2/B4C | 1000 | 1 | 2500 |
| B50 | Ti0.5Al0.5N | 2000 | Ti0.8Si0.2N | 1500 | TiB2/B4C/SiC | 1000 | 1 | 2500 |
| B51 | Ti0.2Cr0.2Al0.6N | 1000 | Ti0.8Si0.2N | 2000 | SiC | 1000 | 1 | 3000 |
| B52 | Ti0.2Cr0.2Al0.6N | 1000 | Ti0.8Si0.2N | 2000 | SiC | 1500 | 1 | 3500 |
| B53 | Ti0.2Cr0.2Al0.6N | 1000 | Ti0.8Si0.2N | 2000 | SiC | 2000 | 1 | 4000 |
| B54 | Ti0.2Cr0.2Al0.6N | 1000 | Ti0.8Si0.2N | 3000 | SiC | 2000 | 1 | 5000 |
| B55 | Ti0.2Cr0.2Al0.6N | 1000 | Ti0.8Si0.2N | 3000 | SiC | 3000 | 1 | 6000 |
| B56 | — | — | Ti0.8Si0.2N | 1500 | SiCN0.1 | 1000 | 1 | 2500 |
| B57 | — | — | Ti0.8Si0.2N | 1500 | SiCN0.3 | 1000 | 1 | 2500 |
| B58 | — | — | Ti0.8Si0.2N | 1500 | SiCN0.6 | 1000 | 1 | 2500 |
| B59 | — | — | Ti0.8Si0.2N | 1500 | TiBN0.1 | 1000 | 1 | 2500 |
| B60 | — | — | Ti0.8Si0.2N | 1500 | BCN0.1 | 1000 | 1 | 2500 |

Specifically, the above mentioned layers were formed in the following method. First, the method included the steps of: introducing a cleaned substrate into the film-formation system; reducing the pressure inside a chamber to be $1 \times 10^{-3}$ Pa or lower, and heating the substrate up to 500° C. Thereafter, the method further included the additional steps of: conducting the sputter cleaning in use of Ar (argon) ion; and introducing $N_2$ gas into the chamber so as to adjust the pressure inside the chamber to be 4 Pa.

In the above environment, the layers A and B were formed with or without forming the underlying layer as shown in Tables 10 and 11.

Herein, the underlying layer and each of the layers A were formed by conducting an arc discharge with the current of 150 A under $N_2$ atmosphere (Note a small amount of $CH_4$ gas was additionally introduced under the conditions of Nos. B14 and B15).

After a layer A was formed, the arc discharge was stopped. Then, a layer B was formed by reducing the pressure to 0.6 Pa with introducing Ar gas into the chamber, and conducting a sputtering process. Thus a pair of layers A and B is formed. The formation of the pairs of layers A and B were repeatedly conducted in this order.

The adhesion performance of the test samples were evaluated by ultrahard alloy-made substrates with films formed under the conditions of Nos. B1-B60. Further, the lifetimes as a tool (or tool lifetimes) of the test samples were evaluated by ultrahard alloy-made inserts with films formed under the conditions of Nos. B1-B60.

The adhesion was evaluated by a scratch test. Each scratch test was conducted by sliding a diamond indenter having a tip radius of 200 μmR was slid on the ultrahard hard alloy-made substrate having the film under the conditions of a load increasing rate of 100 N/min, and a moving speed of 10 mm/min.

Then, after completion of the scratch test, the occurrence of damage on the scratched part of the film was checked by an optical microscope. That is, if any damage was observed on the checked part, the load value at that time was determined as a critical load value. Such critical load values are listed as adhesion (N) in Table 12.

Note tool lifetimes are influenced by combination of various factors including the hardness and the oxidation resistance of each film, the thickness of each film, the overall thickness of the multilayer hard film, the adhesion property of the multilayer hard film to the substrate, and the strength of the substrate. Therefore, the tool lifetime was evaluated by a cutting test. Each cutting test was conducted by the steps of: fixing an ultrahard alloy-made insert with a film to an end mill, and dry-turning a workpiece material under the following conditions:

<Dry Turning Conditions>

Workpiece Material: AISI 316;

Cutting Speed: 200 m/min;

Feed: 0.14 mm/tooth;

Depth of Cut: 4.5 mm; and

Lubrication Test dry.

Table 12 indicates the results of evaluation of the adhesion and the total lifetime of the test samples. Note in the Table 12, an ultrahard alloy-made insert with a film formed under the conditions of No. B1 is used as a reference specimen. The lifetime of the reference specimen is defined as 100%, and a lifetime of each test sample is shown in a percentage relative to the lifetime of the reference specimen. Herein, the data in the table indicate that the higher the percentage becomes, the longer the lifetime becomes.

TABLE 12

| No. | Adhesion | Tool Lifetime (%) | Remarks |
|---|---|---|---|
| B1 | 70 | 100 | Conventional Example |
| B2 | 30 | 55 | Comparison Example |
| B3 | 25 | 37 | Comparison Example |
| B4 | 45 | 60 | Comparison Example |
| B5 | 55 | 65 | Comparison Example |
| B6 | 60 | 70 | Comparison Example |
| B7 | 80 | 115 | Concrete Example |
| B8 | 85 | 120 | Concrete Example |
| B9 | 85 | 120 | Concrete Example |
| B10 | 80 | 115 | Concrete Example |
| B11 | 80 | 120 | Concrete Example |
| B12 | 65 | 90 | Comparison Example |
| B13 | 80 | 125 | Concrete Example |
| B14 | 85 | 130 | Concrete Example |
| B15 | 85 | 125 | Concrete Example |
| B16 | 65 | 65 | Comparison Example |
| B17 | 80 | 115 | Concrete Example |
| B18 | 70 | 90 | Comparison Example |
| B19 | 80 | 105 | Concrete Example |
| B20 | 60 | 70 | Comparison Example |
| B21 | 80 | 110 | Concrete Example |
| B22 | 85 | 125 | Concrete Example |
| B23 | 90 | 140 | Concrete Example |
| B24 | 90 | 120 | Concrete Example |
| B25 | 90 | 125 | Concrete Example |
| B26 | 55 | 65 | Comparison Example |
| B27 | 80 | 120 | Concrete Example |
| B28 | 80 | 110 | Concrete Example |
| B29 | 85 | 115 | Concrete Example |
| B30 | 90 | 145 | Concrete Example |
| B31 | 95 | 135 | Concrete Example |
| B32 | 95 | 135 | Concrete Example |
| B33 | 90 | 130 | Concrete Example |
| B34 | 110 | 160 | Concrete Example |
| B35 | 120 | 180 | Concrete Example |
| B36 | 80 | 120 | Concrete Example |
| B37 | 90 | 125 | Concrete Example |
| B38 | 80 | 115 | Concrete Example |
| B39 | 110 | 155 | Concrete Example |
| B40 | 115 | 160 | Concrete Example |
| B41 | 120 | 170 | Concrete Example |
| B42 | 115 | 165 | Concrete Example |
| B43 | 120 | 165 | Concrete Example |
| B44 | 95 | 140 | Concrete Example |
| B45 | 90 | 130 | Concrete Example |
| B46 | 105 | 150 | Concrete Example |
| B47 | 120 | 170 | Concrete Example |
| B48 | 115 | 160 | Concrete Example |
| B49 | 120 | 165 | Concrete Example |
| B50 | 117 | 160 | Concrete Example |
| B51 | 115 | 160 | Concrete Example |
| B52 | 115 | 170 | Concrete Example |
| B53 | 115 | 175 | Concrete Example |
| B54 | 115 | 175 | Concrete Example |
| B55 | 115 | 170 | Concrete Example |
| B56 | 90 | 130 | Concrete Example |
| B57 | 85 | 120 | Concrete Example |
| B58 | 45 | 65 | Comparison Example |
| B59 | 90 | 115 | Concrete Example |
| B60 | 90 | 120 | Concrete Example |

As indicated in Table 12, test samples prepared under the conditions of Nos. B7-B11, B13-B15, B17, B19, B21-B25, B27-B57, B59 and B60 satisfied the criteria of the present invention. Accordingly, the above listed test samples had higher adhesion (that is, excellent in the adhesion property) between the substrate and the film (or multilayer hard film) and longer tool lifetimes than those of the reference specimen having no layers A and B (that is, conventional example) made under the conditions of No. B1.

In particular, the formation of the underlying layer between the substrate and the layer A under the conditions of Nos. B33-B55 led to the results showing further superior adhesion and longer lifetimes of the test samples made under the conditions of Nos. B33-B55. Above all, the underlying layers were formed of $M_{1-y}Al_y(B_aC_bN_cO_d)$, where $0.05 \leq y \leq 0.8$, $0 \leq a \leq 0.2$, $0 \leq b \leq 0.4$, $0.5 \leq c \leq 1$, $0 \leq d \leq 0.2$, and M was one or more selected from Si, Y, the Group 4A elements, the Group 5A elements, and the Group 6A elements, under the conditions of Nos. B33-B35, B37, and B39-B55. That construction led to the further superior results in the adhesion and tool lifetimes.

In contrast, test samples made under the conditions of Nos. B1-B6, B12, B16, B18, B20, B26 and B58 did not fulfill at least one of the criteria of the present invention. Consequently, this resulted in the lower adhesion and/or shorter lifetimes of the above listed test samples than those of the reference specimen made under the conditions of No. B1.

Specifically, since no layer A was formed in the test sample made under the conditions of Nos. B2-B4, the test samples had lower adhesion and shorter tool lifetimes than the reference specimen made under the conditions of No. B1.

The test sample made under conditions of B5 was prepared without forming a layer A, which resulted in the lower adhesion and shorter tool lifetime thereof than those of the reference specimen made under the conditions of No. B1.

The test sample made under conditions of No. B6 had layers A containing no Si (that is atomic ratio of Si=0), which resulted in the lower adhesion and shorter tool lifetime thereof than those of the reference specimen made under the conditions of No. B1.

The test sample made under conditions of No. B12 had layers A containing Si at the atomic ratio greater than 0.4, which resulted in the shorter tool lifetime thereof than that of the reference specimen made under the conditions of No. B1.

The test sample made under conditions of No. B16 had layers A each having a thickness less than 100 nm, which resulted in the lower adhesion and shorter tool lifetime thereof than those of the reference specimen made under the conditions of No. B1.

The test sample made under conditions of No. B18 had layers B each having a thickness less than 50 nm, which resulted in the lower adhesion and shorter tool lifetime thereof than those of the reference specimen made under the conditions of No. B1.

The test sample made under conditions of No. B20 had layers A and B having a total thickness less than 500 nm, which resulted in the lower adhesion and shorter tool lifetime of thereof than those of the reference specimen made under the conditions of No. B1.

The test sample made under conditions of No. B26 was formed with a film by replacing the layer A with the layer B. That is, the SiC layer was formed at the position of the layer A, and $Ti_{0.6}Si_{0.2}N$ layer was formed at the position of the layer B. That construction resulted in the lower adhesion and shorter tool lifetime thereof than those of the reference specimen made under the conditions of No. B1.

The test sample made under conditions of No. B58 had layers B containing more amount of N, which resulted in the lower adhesion and shorter tool lifetime of thereof than those of the reference specimen made under the conditions of No. B1

Although the present invention has been explained in detail by reference to the embodiments and the concrete examples, the scope of the present invention is not limited to the above mentioned embodiments and examples, and is to be widely construed on the basis of the appended claims. Further, the present invention may be varied and/or modified without departing from the scope of the present invention. Nevertheless, it is obvious that such variations and/or modifications are included in the present invention.

LIST OF REFERENCE SIGNS

1 Multilayer hard film
11 Layer A
12 Layer B
13 Underlying layer
2 Substrate
10, 20, 30, 40 Member

The invention claimed is:
1. A multilayer hard film, comprising:
a pair of layers consisting of:
a layer A consisting of $Ti_{1-x}Si_x$ $(B_pC_qN_r)$ where $0.05 \leq x \leq 0.4$, $p \geq 0$, $q \geq 0$, $r > 0$, and $p+q+r=1$, and having a thickness of 100 nm or less; and
a layer B formed of at least one member selected from the group consisting of $Ti_{1-a-g-b}B_aC_gN_b$ and $Si_{1-c-d}C_cN_d$, $B_{1-e-f}C_eN_f$, where $0.2 \leq a \leq 0.5$, $0.3 \leq b \leq 0.6$, $0.2 \leq c \leq 0.5$, $0.3 \leq d \leq 0.5$, $0.03 \leq e \leq 0.25$, $0.3 \leq f \leq 0.55$ and $0 \leq g \leq 0.5$, and having a thickness of from 2 nm to 20 nm,
wherein
the layer B is formed on the layer A;
the multilayer hard film is formed on a surface of a substrate and is formed by alternately stacking the layer A and the layer B one over the other;
the stacked layers A and B have a total thickness of at least 500 nm; and
an undermost layer A is formed between an undermost layer B and the surface of the substrate.

2. The multilayer hard film according to claim 1, further comprising:
an underlying layer formed between the substrate and an undermost layer A,
wherein the underlying layer comprises $M_{1-y}Al_y(B_aC_bN_cO_d)$, where $0.05 \leq y \leq 0.8$, $0 \leq a \leq 0.2$, $0 \leq b \leq 0.4$, $0.5 \leq c \leq 1$, $0 \leq d \leq 0.2$, and M is at least one element selected from the group consisting of Si, Y, a Group 4A element, a Group 5A element, and a Group 6A element.

3. The multilayer hard film according to claim 2, wherein the underlying layer is formed of at least one selected from the group consisting of AlCr(CN), TiAl(CN), TiCrAl(CN), AlCrSi(CN), TiAlSi(CN), and TiCrAlSi(CN).

4. The multilayer hard film according to claim 1, wherein the substrate is a metal cutting tool.

5. The multilayer hard film according to claim 1, wherein the substrate is a sliding member.

6. The multilayer hard film according to claim 1, wherein the multilayer hard film consists of one or more pairs of the layer A and layer B alternately stacked.

7. The multilayer hard film according to claim 2, wherein the multilayer hard film is formed of the underlying layer, the layer A and the layer B.

8. The multilayer hard film according to claim 1, wherein at least one layer B is formed of at least one selected from the group consisting of TiBN, SiCN and BCN.

9. The multilayer hard film according to claim 1,
which is formed by using a film-formation system having a vacuum arc vaporization source equipped with a target material for forming the layer A and a sputtering evaporation source equipped with a target material for forming the layer B, both sources being arranged in a same chamber,
wherein the film-formation system is configured to rotate the substrate so that the substrate passes multiple times in front of the vacuum arc vaporization source and the sputtering evaporation source in the same chamber; make the vacuum arc vaporization source and the sputtering evaporation source concurrently discharge; and alternately stack the layer A and the layer B in pairs multiple times over the surface of the substrate.

10. A method for forming a multilayer hard film on a surface of a substrate, the method comprising:
forming a layer A consisting of $Ti_{1-x}Si_x$ $(B_pC_qN_r)$ having a thickness of 100 nm or less, where $0.05 \leq x \leq 0.4$, $p \geq 0$, $q \geq 0$, $r > 0$, and $p+q+r=1$, on the surface of the substrate; and
subsequently forming a layer B made of at least one selected from the group consisting of $Ti_{1-a-g-b}B_aC_gN_b$, $Si_{1-c-d}C_cN_d$, $B_{1-e-f}C_eN_f$, $TiB_2$, SiC, and $B_4C$, having a thickness of from 2 to 20 nm, where $0.2 \leq a \leq 0.5$, $0.3 \leq b \leq 0.6$, $0.2 \leq c \leq 0.5$, $0.3 \leq d \leq 0.5$, $0.03 \leq e \leq 0.25$, $0.3 \leq f \leq 0.55$ and $0 \leq g \leq 0.5$;
wherein the layer A and the layer B are alternately stacked one over the other over the surface of the substrate;
the stacked layers A and B have a total thickness of at least 500 nm; and
an undermost layer A is formed between an undermost layer B and the surface of the substrate.

11. A multilayer hard film, comprising:
a pair of layers consisting of:
a layer A consisting of $Ti_{1-x}Si_x$ $(B_pC_qN_r)$ where $0.05 \leq x \leq 0.4$, $p \geq 0$, $q \geq 0$, $r > 0$, and $p+q+r=1$, and having a thickness of at least 100 nm; and
a layer B formed of at least one member selected from the group consisting of $TiB_2$, SiC, and $B_4C$, and having a thickness of at least 50 nm,
wherein
the multilayer hard film is formed on a surface of the substrate and is formed by alternately stacking the layer A and layer B on one another in that order in one or more pairs;
the stacked layers A and B have a total thickness of at least 500 nm; and
an undermost layer A is formed between an undermost layer B and the surface of the substrate.

12. The multilayer hard film according to claim 11, wherein at least one layer B further comprises nitrogen.

13. The multilayer hard film according to claim 11, which is a single pair of the layer A arranged on the surface of the substrate, and the layer B arranged on the layer A.

14. The multilayer hard film according to claim 11, wherein the substrate is a metal cutting tool.

15. The multilayer hard film according to claim 11, wherein the substrate is a sliding member.

16. The multilayer hard film according to claim 11, wherein the multilayer hard film consists of one or more pairs of the layer A and layer B alternately stacked.

17. The multilayer hard film according to claim 11,
which is formed by using a film-formation system having a vacuum arc vaporization source equipped with a target material for forming the layer A and a sputtering evaporation source equipped with a target material for forming the layer B, both sources being arranged in a same chamber,
wherein the film-formation system is configured to rotate the substrate so that the substrate passes multiple times in front of the vacuum arc vaporization source and the sputtering evaporation source in the same chamber; make the vacuum arc vaporization source and the sputtering evaporation source concurrently discharge; and alternately stack the layer A and the layer B in pairs multiple times over the surface of the substrate.

* * * * *